US009815940B2

(12) United States Patent
Eckes et al.

(10) Patent No.: US 9,815,940 B2
(45) Date of Patent: *Nov. 14, 2017

(54) POLYMERS CONTAINING SUBSTITUTED TRIARYLAMINE UNITS AND ELECTROLUMINESCENT DEVICES CONTAINING SAID POLYMERS

(71) Applicant: Merck Patent GmbH, Darmstadt (DE)

(72) Inventors: Fabrice Eckes, Darmstadt (DE); Katja Stegmaier, Darmstadt (DE); Anna Hayer, Mainz (DE); Holger Heil, Frankfurt am Main (DE); Dominik Joosten, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 176 days.

This patent is subject to a terminal disclaimer.

(21) Appl. No.: 14/394,306

(22) PCT Filed: Apr. 15, 2013

(86) PCT No.: PCT/EP2013/001096
§ 371 (c)(1),
(2) Date: Oct. 14, 2014

(87) PCT Pub. No.: WO2013/156130
PCT Pub. Date: Oct. 24, 2013

(65) Prior Publication Data
US 2015/0069303 A1 Mar. 12, 2015

(30) Foreign Application Priority Data
Apr. 17, 2012 (EP) .................................... 12002655

(51) Int. Cl.
C08G 73/02 (2006.01)
C08G 61/12 (2006.01)
C08L 65/00 (2006.01)
C08L 79/02 (2006.01)
H01L 51/00 (2006.01)
C08G 61/10 (2006.01)
H01L 51/50 (2006.01)

(52) U.S. Cl.
CPC ........... *C08G 73/026* (2013.01); *C08G 61/10* (2013.01); *C08G 61/12* (2013.01); *C08G 61/128* (2013.01); *C08G 73/0273* (2013.01); *C08L 65/00* (2013.01); *C08L 79/02* (2013.01); *H01L 51/0035* (2013.01); *H01L 51/0039* (2013.01); *H01L 51/0043* (2013.01); *H01L 51/5012* (2013.01); *C08G 2261/12* (2013.01); *C08G 2261/135* (2013.01); *C08G 2261/148* (2013.01); *C08G 2261/1412* (2013.01); *C08G 2261/312* (2013.01); *C08G 2261/3142* (2013.01); *C08G 2261/3162* (2013.01); *C08G 2261/411* (2013.01); *C08G 2261/76* (2013.01); *C08G 2261/95* (2013.01); *H01L 51/0037* (2013.01); *H01L 51/0067* (2013.01); *H01L 51/0085* (2013.01); *H01L 51/50* (2013.01); *H01L 51/5056* (2013.01); *H01L 51/5072* (2013.01); *H01L 51/5088* (2013.01); *Y02E 10/549* (2013.01)

(58) Field of Classification Search
CPC ...... C08G 61/10; C08G 61/12; C08G 61/128; C08G 73/026; C08G 73/0273; C08L 65/00; C08L 79/02; H01L 51/0035; H01L 51/0039; H01L 51/0043
USPC ............................................. 252/500; 528/7
See application file for complete search history.

(56) References Cited

U.S. PATENT DOCUMENTS

| 6,861,502 | B1* | 3/2005 | Towns | C08G 61/02 257/40 |
| 9,102,797 | B2* | 8/2015 | Schulte | C08G 61/12 |
| 2006/0210827 | A1* | 9/2006 | Becker | C09K 11/06 428/690 |
| 2008/0102312 | A1 | 5/2008 | Parham et al. | |
| 2008/0217605 | A1* | 9/2008 | Wallace | C08G 61/122 257/40 |
| 2008/0274303 | A1* | 11/2008 | Agata | C08G 61/02 428/1.1 |
| 2009/0146164 | A1* | 6/2009 | Tierney | C07C 211/54 257/98 |
| 2009/0209715 | A1* | 8/2009 | Ohuchi | C08G 61/125 526/258 |
| 2014/0138661 | A1* | 5/2014 | Ludemann | H01L 51/0061 257/40 |
| 2015/0069303 | A1* | 3/2015 | Eckes | C08G 61/12 252/500 |

(Continued)

FOREIGN PATENT DOCUMENTS

| CN | 1906229 A | 1/2007 |
| CN | 1947274 A | 4/2007 |
| EP | 1724294 A1 | 11/2006 |

(Continued)

OTHER PUBLICATIONS

International Search Report for PCT/EP2013/001096 dated Jul. 19, 2013.

*Primary Examiner* — Douglas McGinty

(57) ABSTRACT

The present invention relates to polymers which contain triarylamine repeating units that are substituted in the ortho position, methods for the production thereof, and the use thereof in electronic devices, especially in organic electroluminescent devices, so-called OLEDs (OLED=Organic Light Emitting Diode). The present invention also relates to organic electroluminescent devices which contain said polymers.

15 Claims, No Drawings

(56) References Cited

U.S. PATENT DOCUMENTS

2015/0076415 A1* 3/2015 Heil ................ C08G 61/12
  252/500
2015/0108408 A1  4/2015 Eckes et al.

FOREIGN PATENT DOCUMENTS

| EP | 1892258 A1 | 2/2008 |
| JP | 2004087395 A | 3/2004 |
| WO | WO-0055927 A1 | 9/2000 |
| WO | WO-02051958 A1 | 7/2002 |
| WO | WO-2005056638 A1 | 6/2005 |
| WO | WO-2006070184 A1 | 7/2006 |
| WO | WO-13156125 A1 | 10/2013 |

* cited by examiner

POLYMERS CONTAINING SUBSTITUTED TRIARYLAMINE UNITS AND ELECTROLUMINESCENT DEVICES CONTAINING SAID POLYMERS

CROSS-REFERENCE TO RELATED APPLICATIONS

This application is a national stage application (under 35 U.S.C. §371) of PCT/EP2013/001096, filed Apr. 15, 2013, which claims benefit of European Application No. 12002655.4, filed Apr. 17, 2012, both of which are incorporated herein by reference in their entirety.

The present invention relates to polymers containing substituted triarylamine recurring units, to a process for the preparation thereof and to the use thereof in electronic or opto-electronic devices, in particular in organic electroluminescent devices, so-called OLEDs (OLED=organic light emitting diodes). In addition, the present invention also relates to organic electroluminescent devices comprising these polymers.

In electronic or opto-electronic devices, in particular in organic electroluminescent devices (OLED), components of various functionality are required. In OLEDs, the different functionalities are normally present in different layers. In this case, the term multilayered OLED systems is used. These multilayered OLED systems have, inter alia, charge-injecting layers, such as, for example, electron- and hole-injecting layers, charge-transporting layers, such as, for example, electron- and hole-conducting layers, and layers which comprise light-emitting components. These multilayered OLED systems are generally produced by successive layer-wise application.

If a plurality of layers are applied from solution, it must be ensured that a layer that has already been applied is not destroyed after it has been dried, by the subsequent application of the solution for the production of the next layer. This can be achieved, for example, by making a layer insoluble, for example by crosslinking. Such processes are disclosed, for example, in EP 0 637 899 and WO 96/20253.

In addition, however, it is also necessary to match the functionalities of the individual layers to one another from the material side in such a way that the best possible results, for example with respect to lifetime, efficiency, etc., are achieved. Thus, in particular, the layers which are directly adjacent to an emitting layer, in particular the hole-transporting layer (HTL=hole transport layer), have a significant influence on the properties of the adjacent emitting layer.

One of the objects of the present invention was therefore to provide compounds which, on the one hand, can be processed from solution and which, on the other hand, result in an improvement in the properties of the device, i.e., in particular, the OLED, on use in electronic or opto-electronic devices, preferably in OLEDs, and here in particular in the hole-transport layer thereof.

Surprisingly, it has been found that polymers which contain triarylamine recurring units in which at least one aryl group is substituted in the ortho-position, in particular on use in the hole-transporting layer of OLEDs, result in a significant increase in the lifetime of these OLEDs.

The present application thus relates to a polymer which contains at least one structural unit of the following formula (I):

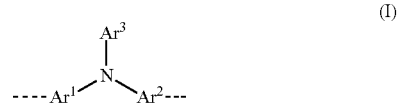

where
Ar$^1$ to Ar$^3$ is on each occurrence, in each case identically or differently, a mono- or polycyclic, aromatic or heteroaromatic ring system having 5 to 60 aromatic ring atoms, which may be substituted by one or more radicals R;
R is on each occurrence, identically or differently, H, D, F, Cl, Br, I, N(R$^1$)$_2$, CN, NO$_2$, Si(R$^1$)$_3$, B(OR$^1$)$_2$, C(=O)R$^1$, P(=O)(R$^1$)$_2$, S(=O)R$^1$, S(=O)$_2$R$^1$, OSO$_2$R$^1$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals R$^1$, where one or more non-adjacent CH$_2$ groups may be replaced by R$^1$C=CR$^1$, C=C, Si(R$^1$)$_2$, C=O, C=S, C=NR$^1$, P(=O)(R$^1$), SO, SO$_2$, NR$^1$, O, S or CONR$^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals R$^1$, or an aryloxy or heteroaryloxy group having 5 to 60 aromatic ring atoms, which may be substituted by one or more radicals R$^1$, or an aralkyl or heteroaralkyl group having 5 to 60 aromatic ring atoms, which may be substituted by one or more radicals R$^1$, or a diarylamino group, diheteroarylamino group or arylheteroarylamino group having 10 to 40 aromatic ring atoms, which may be substituted by one or more radicals R$^1$, or a crosslinkable group Q, where two or more radicals R may also form a mono- or polycyclic, aliphatic, aromatic and/or benzo-fused ring system with one another;
R$^1$ is on each occurrence, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F; where two or more substituents R$^1$ may also form a mono- or polycyclic, aliphatic or aromatic ring system with one another; and
the dashed lines represent bonds to adjacent structural units in the polymer.
characterised in that Ar$^3$ is substituted by Ar$^4$ in at least one, preferably in one of the two ortho positions, where Ar$^4$ is a mono- or polycyclic, aromatic or heteroaromatic ring system having 5 to 60 aromatic ring atoms, which may be substituted by one or more radicals R.

Ar$^4$ here may either be linked directly, i.e. via a single bond, to Ar$^3$ or alternatively via a linking group X.

The structural unit of the formula (I) thus preferably has the structure of the following formula (Ia):

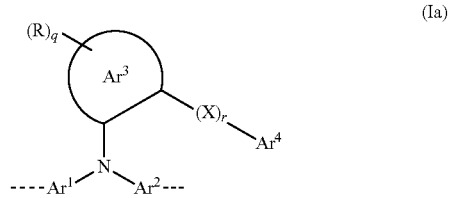

where $Ar^1$, $Ar^2$, $Ar^3$, $Ar^4$ and R can adopt the meanings indicated above,
q=0, 1, 2, 3, 4, 5 or 6, preferably 0, 1, 2, 3 or 4,
X=$CR_2$, NR, $SiR_2$, O, S, C=O or P=O, preferably $CR_2$, NR, O or S, and
r=0 or 1, preferably 0.

In the present application, the term polymer is taken to mean both polymeric compounds, oligomeric compounds and dendrimers. The polymeric compounds according to the invention preferably contain 10 to 10000, particularly preferably 10 to 5000 and very particularly preferably 10 to 2000 structural units (i.e. recurring units). The oligomeric compounds according to the invention preferably contain 3 to 9 structural units. The branching factor of the polymers here is between 0 (linear polymer, no branching points) and 1 (fully branched dendrimer).

The polymers according to the invention preferably have a molecular weight $M_w$ in the range from 1,000 to 2,000,000 g/mol, particularly preferably a molecular weight $M_w$ in the range from 10,000 to 1,500,000 g/mol and very particularly preferably a molecular weight $M_w$ in the range from 50,000 to 1,000,000 g/mol. The molecular weight $M_w$ is determined by means of GPC (=gel permeation chromatography) against an internal polystyrene standard.

The polymers according to the invention are either conjugated, partially conjugated or non-conjugated polymers. Preference is given to conjugated or partially conjugated polymers.

The structural units of the formula (I) can in accordance with the invention be incorporated into the main chain or into the side chain of the polymer. However, the structural units of the formula (I) are preferably incorporated into the main chain of the polymer. In the case of incorporation into the side chain of the polymer, the structural units of the formula (I) can be either monovalent or divalent, i.e. they have either one of two bonds to adjacent structural units in the polymer.

"Conjugated polymers" in the sense of the present application are polymers which contain principally sp-hybridised (or optionally also sp-hybridised) carbon atoms in the main chain, which may also be replaced by correspondingly hybridised heteroatoms. In the simplest case, this means the alternating presence of double and single bonds in the main chain, but polymers containing units such as, for example, a meta-linked phenylene are also intended to be regarded as conjugated polymers in the sense of this application. "Principally" means that naturally (spontaneously) occurring defects which result in conjugation interruptions do not devalue the term "conjugated polymer". The term conjugated polymers is likewise applied to polymers having a conjugated main chain and non-conjugated side chains. Furthermore, the term conjugated is likewise used in the present application if the main chain contains, for example, arylamine units, arylphosphine units, certain heterocycles (i.e. conjugation via N, O or S atoms) and/or organometallic complexes (i.e. conjugation via the metal atom). An analogous situation applies to conjugated dendrimers. By contrast, units such as, for example, simple alkyl bridges, (thio)ether, ester, amide or imide links are clearly defined as non-conjugated segments.

A partially conjugated polymer in the present application is intended to be taken to mean a polymer which contains conjugated regions which are separated from one another by non-conjugated sections, specific conjugation interrupters (for example spacer groups) or branches, for example in which relatively long conjugated sections in the main chain are interrupted by non-conjugated sections, or which contains relatively long conjugated sections in the side chains of a polymer which is non-conjugated in the main chain. Conjugated and partially conjugated polymers may also contain conjugated, partially conjugated or non-conjugated dendrimers.

The term "dendrimer" in the present application is intended to be taken to mean a highly branched compound built up from a multifunctional centre (core), to which branched monomers are bonded in a regular structure, so that a tree-like structure is obtained. Both the core and also the monomers here can adopt any desired branched structures which consist both of purely organic units and also organometallic compounds or coordination compounds. "Dendrimer" here is generally intended to be understood as described, for example, by M. Fischer and F. Vögtle (*Angew. Chem., Int. Ed.* 1999, 38, 885).

The term "structural unit" in the present application is taken to mean a unit which, starting from a monomer unit which contains at least two, preferably two, reactive groups, is incorporated into the polymer backbone as a part thereof by reaction with bond formation and is thus present in the polymer prepared as linked recurring unit.

The term "mono- or polycyclic, aromatic ring system" in the present application is taken to mean an aromatic ring system having 6 to 60, preferably 6 to 30 and particularly preferably 6 to 24 aromatic ring atoms, which does not necessarily contain only aromatic groups, but instead in which a plurality of aromatic units may also be interrupted by a short non-aromatic unit (<10% of the atoms other than H, preferably <5% of the atoms other than H), such as, for example, an $sp^3$-hybridised C atom or O or N atom, a CO group, etc. Thus, for example, systems such as, for example, 9,9'-spirobifluorene, 9,9-diarylfluorene and 9,9-dialkylfluorene are also intended to be taken to be aromatic ring systems.

The aromatic ring systems may be mono- or polycyclic, i.e. they may contain one ring (for example phenyl) or a plurality of rings, which may also be condensed (for example naphthyl) or covalently linked (for example biphenyl), or contain a combination of condensed and linked rings.

Preferred aromatic ring systems are, for example, phenyl, biphenyl, terphenyl, [1,1':3',1"]terphenyl-2'-yl, quaterphenyl, naphthyl, anthracene, binaphthyl, phenanthrene, dihydrophenanthrene, pyrene, dihydropyrene, chrysene, perylene, tetracene, pentacene, benzopyrene, fluorene, indene, indenofluorene and spirobifluorene.

The term "mono- or polycyclic, heteroaromatic ring system" in the present application is taken to mean an aromatic ring system having 5 to 60, preferably 5 to 30 and particularly preferably 5 to 24 aromatic ring atoms, where one or more of these atoms is (are) a heteroatom. The "mono- or polycyclic, heteroaromatic ring system" does not necessarily contain only aromatic groups, but instead may also be interrupted by a short non-aromatic unit (<10% of the atoms other than H, preferably <5% of the atoms other than H), such as, for example, an $sp^3$-hybridised C atom or O or N atom, a CO group, etc.

The heteroaromatic ring systems may be mono- or polycyclic, i.e. they may contain one ring or a plurality of rings, which may also be condensed or covalently linked (for example pyridylphenyl), or contain a combination of condensed and linked rings. Preference is given to fully conjugated heteroaryl groups.

Preferred heteroaromatic ring systems are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or groups having a plurality of rings, such as carbazole, indenocarbazole, indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene or combinations of these groups.

The mono- or polycyclic, aromatic or heteroaromatic ring system may be unsubstituted or substituted. Substituted in the present application means that the mono- or polycyclic, aromatic or heteroaromatic ring system contains one or more substituents R.

R is on each occurrence preferably, identically or differently, H, D, F, Cl, Br, I, $N(R^1)_2$, CN, $NO_2$, $Si(R^1)_3$, $B(OR^1)_2$, $C(=O)R^1$, $P(=O)(R^1)_2$, $S(=O)R^1$, $S(=O)_2R^1$, $OSO_2R^1$, a straight-chain alkyl, alkoxy or thioalkoxy group having 1 to 40 C atoms or an alkenyl or alkynyl group having 2 to 40 C atoms or a branched or cyclic alkyl, alkoxy or thioalkoxy group having 3 to 40 C atoms, each of which may be substituted by one or more radicals $R^1$, where one or more non-adjacent $CH_2$ groups may be replaced by $R^1C=CR^1$, $C\equiv C$, $Si(R^1)_2$, $C=O$, $C=S$, $C=NR^1$, $P(=O)(R^1)$, SO, $SO_2$, $NR^1$, O, S or $CONR^1$ and where one or more H atoms may be replaced by D, F, Cl, Br, I or CN, or an aromatic or heteroaromatic ring system having 5 to 60 aromatic ring atoms, which may in each case be substituted by one or more radicals $R^1$, or an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may be substituted by one or more radicals $R^1$, or a diarylamino group, diheteroarylamino group or arylheteroarylamino group having 10 to 40 aromatic ring atoms, which may be substituted by one or more radicals $R^1$, or a crosslinkable group Q; two or more radicals R here may also form a mono- or polycyclic, aliphatic, aromatic and/or benzo-fused ring system with one another.

R is on each occurrence particularly preferably, identically or differently, H, D, F, Cl, Br, I, $N(R^1)_2$, $Si(R^1)_3$, $B(OR^1)_2$, $C(=O)R^1$, $P(=O)(R^1)_2$, a straight-chain alkyl or alkoxy group having 1 to 20 C atoms or an alkenyl or alkynyl group having 2 to 20 C atoms or a branched or cyclic alkyl or alkoxy group having 3 to 20 C atoms, each of which may be substituted by one or more radicals $R^1$, where one or more non-adjacent $CH_2$ groups may be replaced by $R^1C=CR^1$, $C\equiv C$, $Si(R^1)_2$, $C=O$, $C=NR^1$, $P(=O)(R^1)$, $NR^1$, O or $CONR^1$ and where one or more H atoms may be replaced by F, Cl, Br or I, or an aromatic or heteroaromatic ring system having 5 to 30 aromatic ring atoms, which may in each case be substituted by one or more radicals $R^1$, or an aryloxy or heteroaryloxy group having 5 to 30 aromatic ring atoms, which may be substituted by one or more radicals $R^1$, or an aralkyl or heteroaralkyl group having 5 to 30 aromatic ring atoms, which may be substituted by one or more radicals $R^1$, or a diarylamino group, diheteroarylamino group or arylheteroarylamino group having 10 to 20 aromatic ring atoms, which may be substituted by one or more radicals $R^1$, or a crosslinkable group Q; two or more radicals R here may also form a mono- or polycyclic, aliphatic, aromatic and/or benzo-fused ring system with one another.

R is on each occurrence very particularly preferably, identically or differently, H, a straight-chain alkyl or alkoxy group having 1 to 10 C atoms or an alkenyl or alkynyl group having 2 to 10 C atoms or a branched or cyclic alkyl or alkoxy group having 3 to 10 C atoms, each of which may be substituted by one or more radicals $R^1$, where one or more non-adjacent $CH_2$ groups may be replaced by $R^1C=CR^1$, $C\equiv C$, $C=O$, $C=NR^1$, $NR^1$, O or $CONR^1$, or an aromatic or heteroaromatic ring system having 5 to 20 aromatic ring atoms, which may in each case be substituted by one or more radicals $R^1$, or an aryloxy or heteroaryloxy group having 5 to 20 aromatic ring atoms, which may be substituted by one or more radicals $R^1$, or an aralkyl or heteroaralkyl group having 5 to 20 aromatic ring atoms, which may be substituted by one or more radicals $R^1$, or a diarylamino group, diheteroarylamino group or arylheteroarylamino group having 10 to 20 aromatic ring atoms, which may be substituted by one or more radicals $R^1$, or a crosslinkable group Q; two or more radicals R here may also form a mono- or polycyclic, aliphatic, aromatic and/or benzo-fused ring system with one another.

Preferred alkyl groups having 1 to 10 C atoms are depicted in the following table:

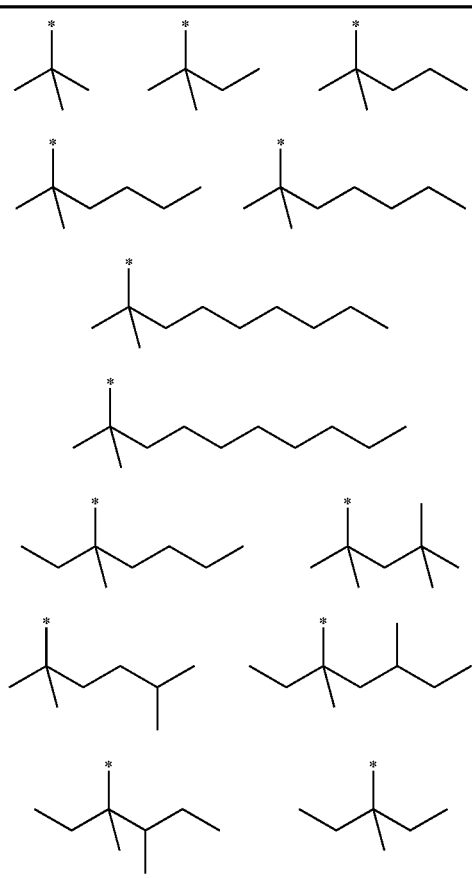

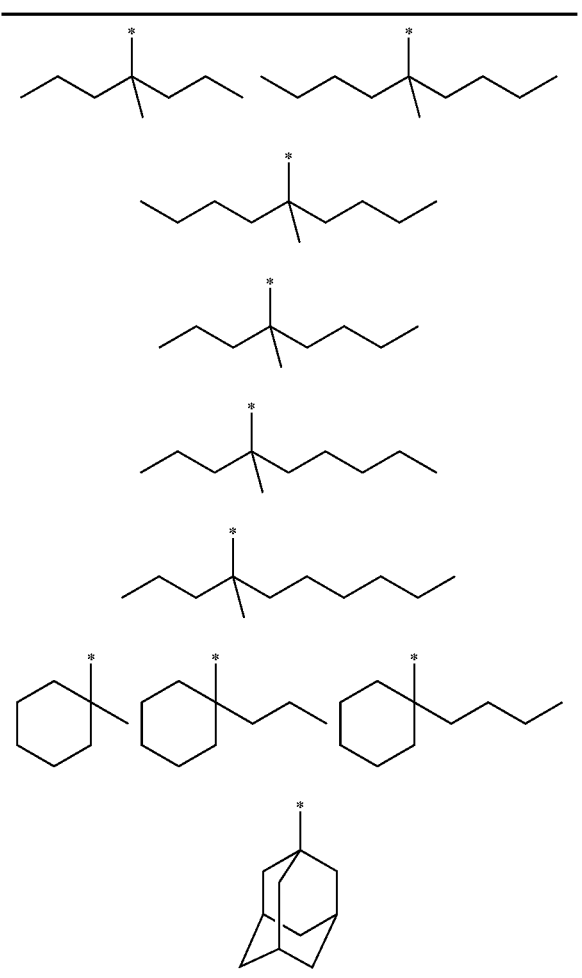

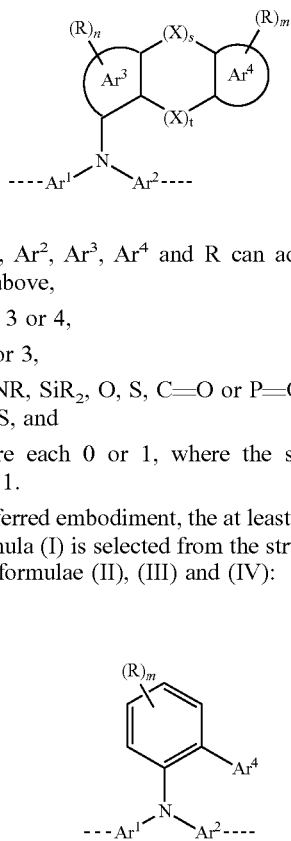

where $Ar^1$, $Ar^2$, $Ar^3$, $Ar^4$ and R can adopt the meanings indicated above, m=0, 1, 2, 3 or 4, n=0, 1, 2 or 3, X=$CR_2$, NR, $SiR_2$, O, S, C=O or P=O, preferably $CR_2$, NR, O or S, and s and t are each 0 or 1, where the sum (s+t)=1 or 2, preferably 1.

In a preferred embodiment, the at least one structural unit of the formula (I) is selected from the structural units of the following formulae (II), (III) and (IV):

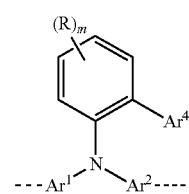
(II)

$R^1$ is on each occurrence preferably, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F; two or more substituents $R^1$ here may also form a mono- or polycyclic, aliphatic or aromatic ring system with one another.

$R^1$ is on each occurrence particularly preferably, identically or differently, H, D or an aliphatic hydrocarbon radical having 1 to 20 C atoms, an aromatic and/or a heteroaromatic hydrocarbon radical having 5 to 20 C atoms; two or more substituents $R^1$ here may also form a mono- or polycyclic, aliphatic or aromatic ring system with one another.

$R^1$ is on each occurrence very particularly preferably, identically or differently, H or an aliphatic hydrocarbon radical having 1 to 10 C atoms, an aromatic and/or a heteroaromatic hydrocarbon radical having 5 to 10 C atoms.

In a second embodiment of the present invention, the at least one structural unit of the formula (I) of the polymer according to the invention is characterised in that $Ar^3$ is substituted by $Ar^4$ in one of the two ortho positions, and $Ar^3$ is additionally linked to $Ar^4$ in the meta position that is adjacent to the substituted ortho position.

The structural unit of the formula (I) thus preferably has the structure of the following formula (Ib):

(III)

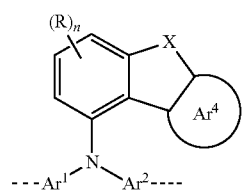

(IV)

where $Ar^1$, $Ar^2$, $Ar^4$ and R can adopt the meanings indicated above, m=0, 1, 2, 3 or 4, n=0, 1, 2 or 3, and X=$CR_2$, NR, $SiR_2$, O, S, C=O or P=O, preferably $CR_2$, NR, O or S.

In a particularly preferred embodiment, the at least one structural unit of the formula (II) is selected from the structural unit of the following formula (V).

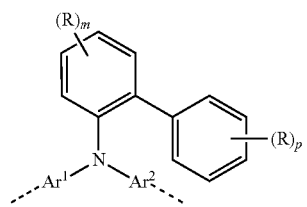
(V)

where Ar¹, Ar², R and m can adopt the meanings indicated above, and p=0, 1, 2, 3, 4 or 5.

Examples of preferred structural units of the formula (V) are depicted in the following table.

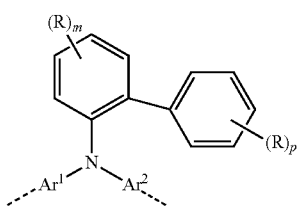
(Va)

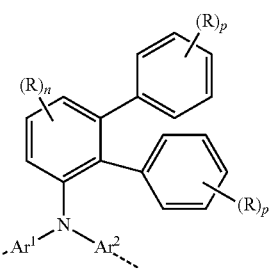
(Vb)

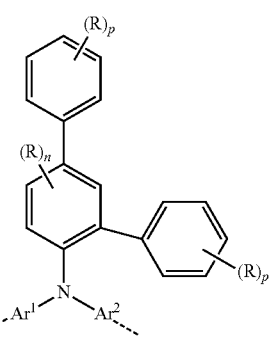
(Vc)

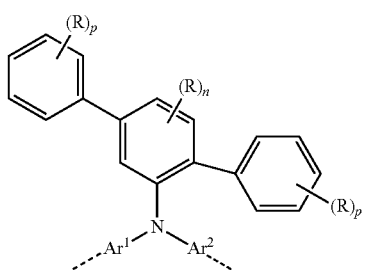
(Vd)

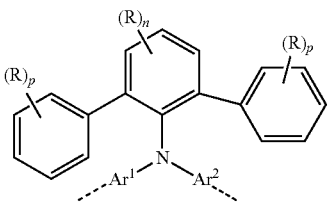
(Ve)

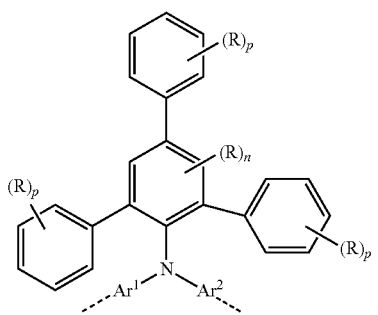
(Vf)

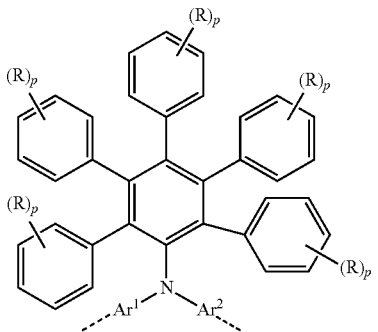
(Vg)

(Vh)

where Ar¹, Ar², R, m, n and p can adopt the meanings indicated above, and k=0, 1 or 2.

In a further particularly preferred embodiment, the at least one structural unit of the formula (III) is selected from the structural unit of the following formula (VI):

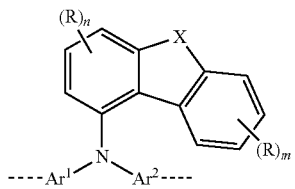
(VI)

where Ar¹, Ar², R, m and n can adopt the meanings indicated above.

Examples of preferred structural units of the formula (VI) are depicted in the following table:

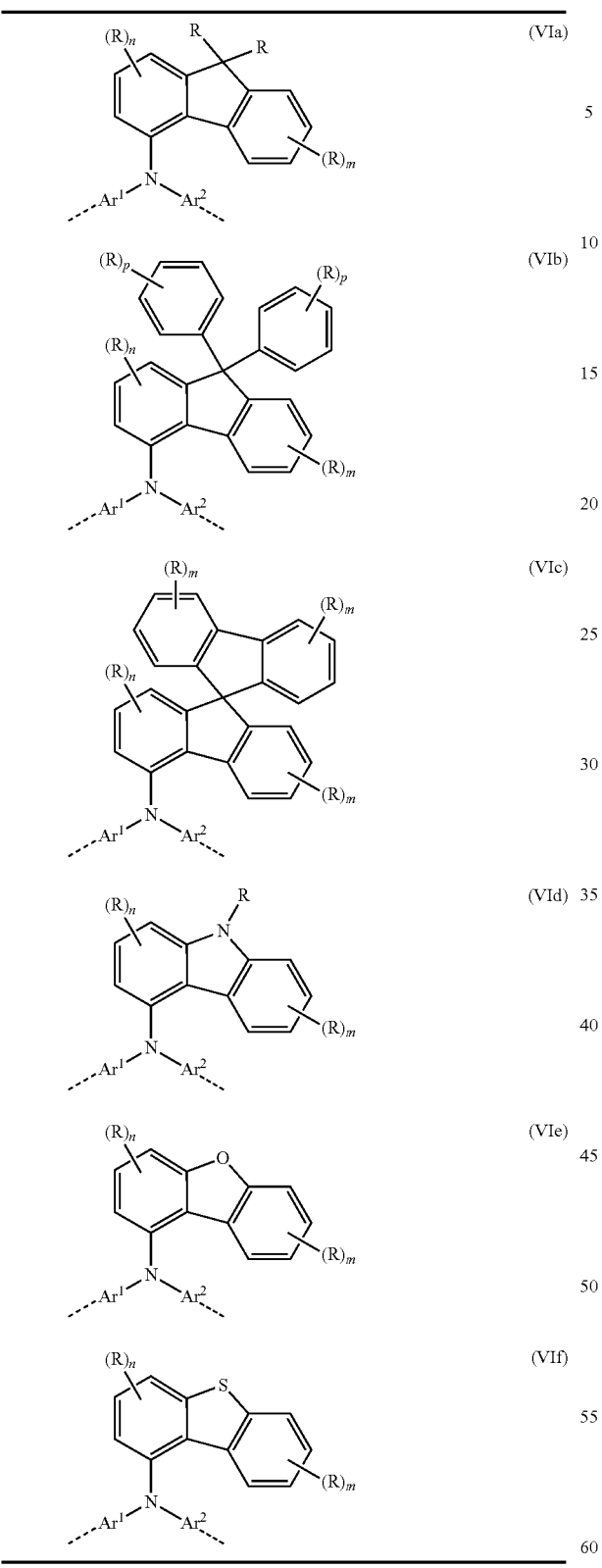

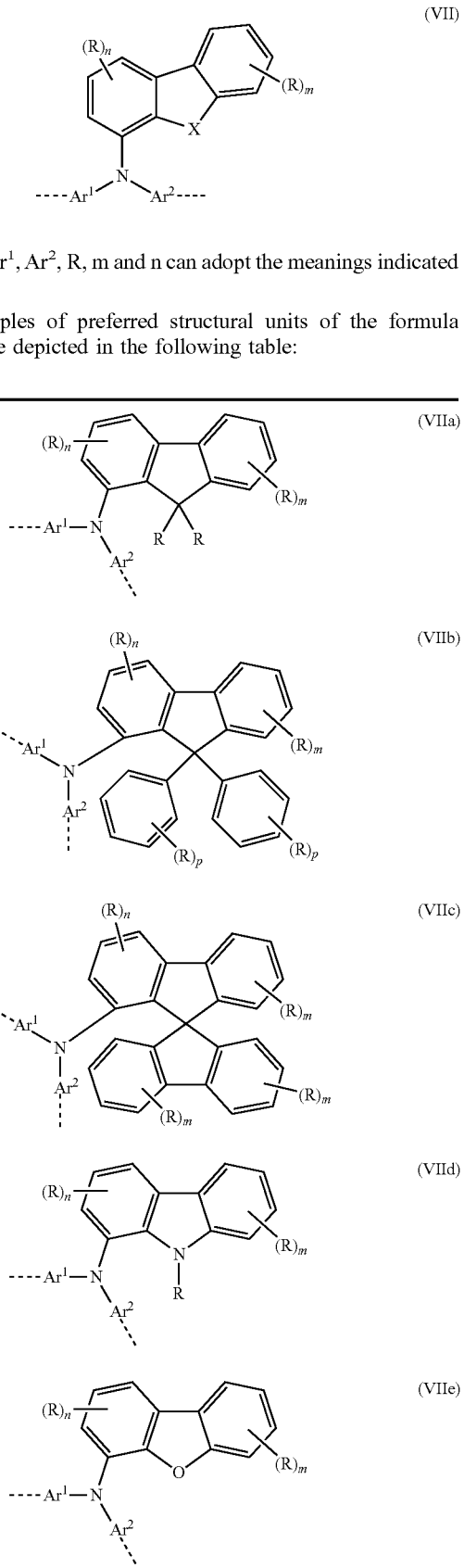

where $Ar^1$, $Ar^2$, R, m and n can adopt the meanings indicated above.

Examples of preferred structural units of the formula (VII) are depicted in the following table:

where $Ar^1$, $Ar^2$, R, m, n and p can adopt the meanings indicated above.

In still a further particularly preferred embodiment, the at least one structural unit of the formula (IV) is selected from the structural unit of the following formula (VII):

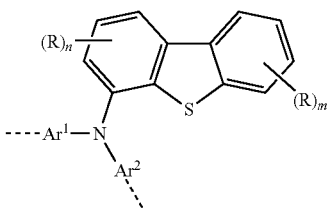
(VIIf)

where Ar¹, Ar², R, m, n and p can adopt the meanings indicated above.

In a very particularly preferred embodiment, the at least one structural unit of the formula (V) is selected from the structural unit of the following formula (VIII):

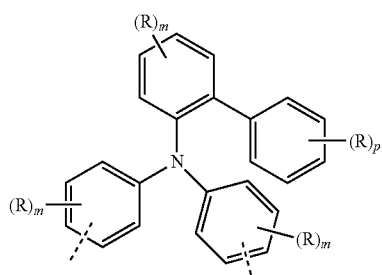
(VIII)

where R, m and p can adopt the meanings indicated above.

Examples of preferred structural units of the formula (VIII) are depicted in the following table:

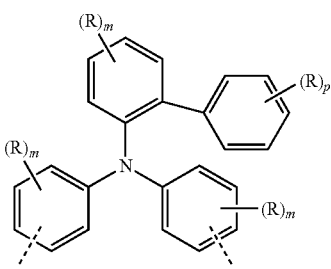
(VIIIa)

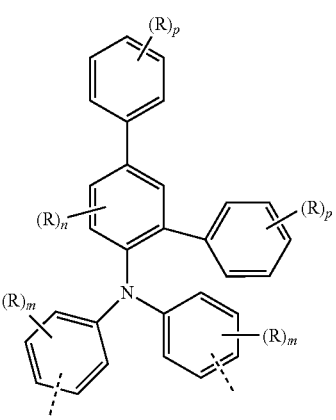
(VIIIb)

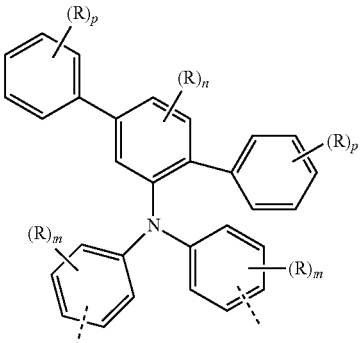
(VIIIc)

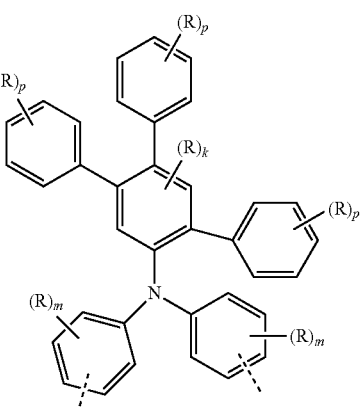
(VIIId)

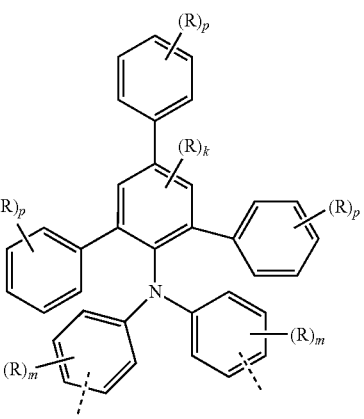
(VIIIe)

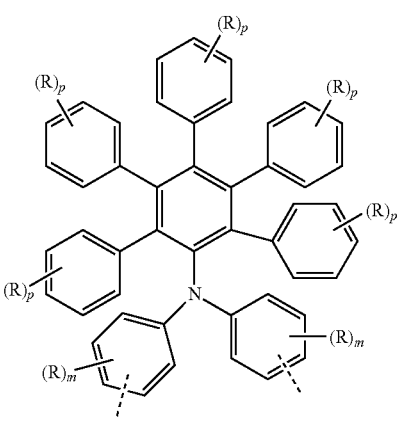
(VIIIf)

-continued

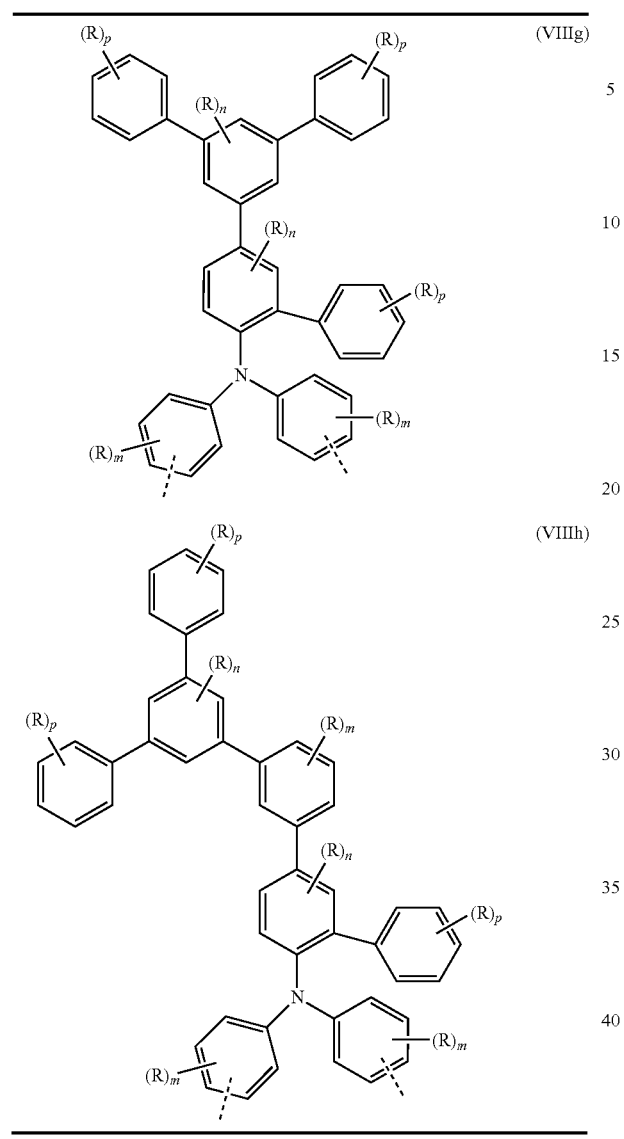

where R, k, m, n and p can adopt the meanings indicated above.

In a further very particularly preferred embodiment, the at least one structural unit of the formula (VI) is selected from the structural unit of the following formula (IX):

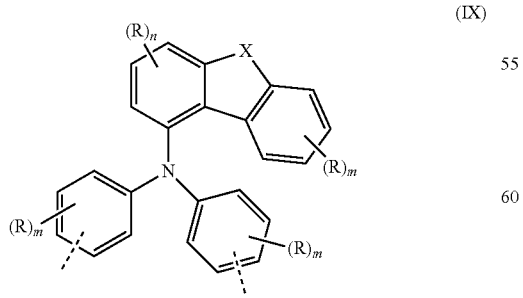

where R, X, m and n can adopt the meanings indicated above.

Examples of preferred structural units of the formula (IX) are depicted in the following table:

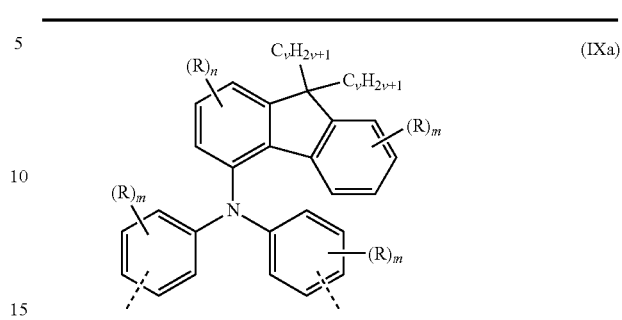

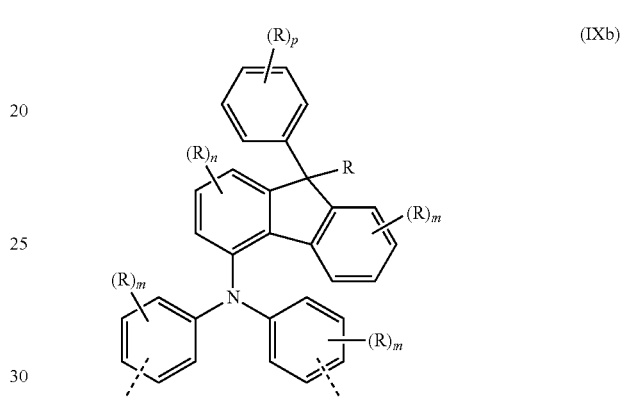

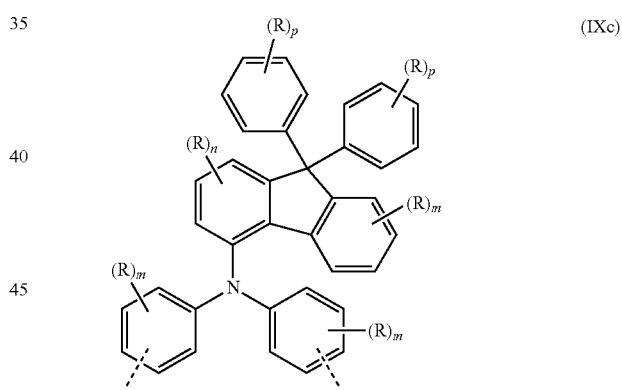

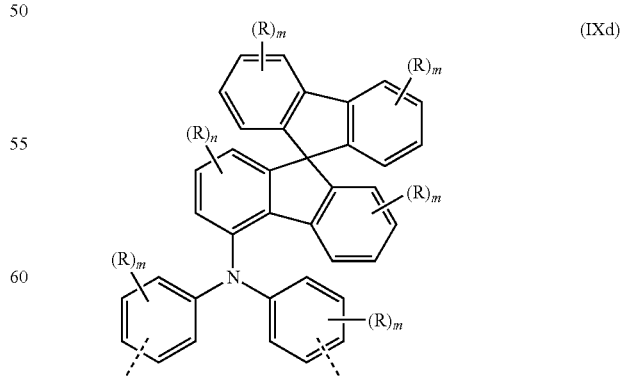

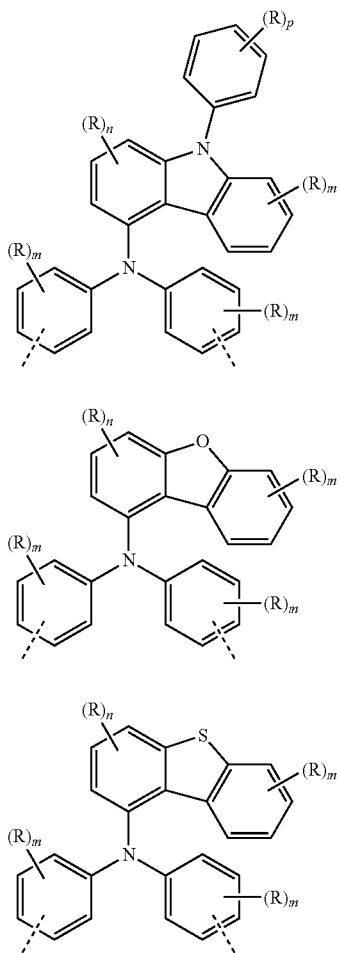

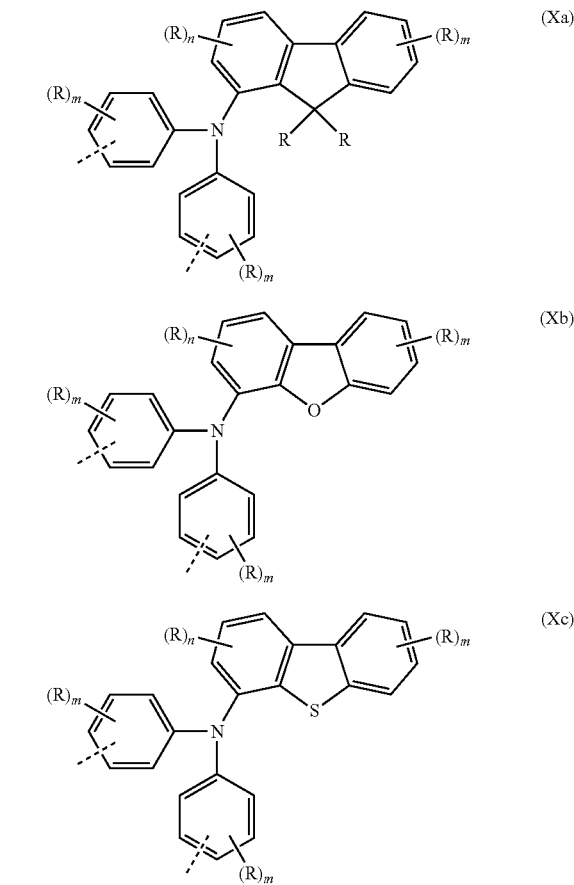

where R, m, n and p can adopt the meanings indicated above, and v=1 to 20, preferably 1 to 10.

In still a further very particularly preferred embodiment, the at least one structural unit of the formula (VII) is selected from the structural unit of the following formula (X):

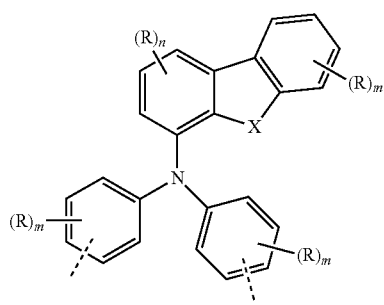

where R, X, m and n can adopt the meanings indicated above.

Examples of preferred structural units of the formula (X) are depicted in the following table:

where R, m and n can adopt the meanings indicated above

In the formulae (VIII), (IX) and (X), and their preferred embodiments of the formulae (VIIIa) to (VIIIh), (IXa) to (IXg) and (Xa) to (Xc), dashed lines represent the bonds to the adjacent structural units in the polymer. They can be arranged here, independently of one another, identically or differently, in the ortho-, meta- or para-position, preferably identically in the ortho-, meta- or para-position, particularly preferably in the meta- or para-position and very particularly preferably in the para-position.

The proportion of structural units of the formula (I), (II), (III), (IV), (V), (VI), (VII), (VIII), (IX) or (X) in the polymer is in the range from 1 to 100 mol %.

In a first preferred embodiment, the polymer according to the invention contains only one structural unit of the formula (I), (II), (III), (IV), (V), (VI), (VII), (VIII), (IX) or (X), i.e. its proportion in the polymer is 100 mol %. In this case, the polymer according to the invention is a homopolymer.

In a second preferred embodiment, the proportion of structural units of the formula (I), (II), (III), (IV), (V), (VI), (VII), (VIII), (IX) or (X) in the polymer is in the range from 50 to 95 mol %, particularly preferably in the range from 60 to 95 mol %, based on 100 mol % of all copolymerisable monomers which are present as structural units in the polymer, i.e. that the polymer according to the invention, besides one or more structural units of the formula (I), (II), (III), (IV), (V), (VI), (VII), (VIII), (IX) and/or (X), also contains further structural units which are different from the structural units of the formulae (I), (II), (III), (IV), (V), (VI), (VII), (VIII), (IX) and (X).

In a third preferred embodiment, the proportion of structural units of the formula (I), (II), (III), (IV), (V), (VI), (VII), (VIII), (IX) or (X) in the polymer is in the range from 5 to 50 mol %, particularly preferably in the range from 25 to 50 mol %, based on 100 mol % of all copolymerisable monomers which are present as structural units in the polymer, i.e. that the polymer according to the invention, besides one or more structural units of the formula (I), (II), (III), (IV), (V), (VI), (VII), (VIII), (IX) and/or (X), also contains further structural units which are different from the structural units of the formulae (I), (II), (III), (IV), (V), (VI), (VII), (VIII), (IX) and (X)

These structural units, which are different from the structural units of the formulae (I), (II), (III), (IV), (V), (VI), (VII), (VIII), (IX) and (X), are, inter alia, those as disclosed and extensively listed in WO 02/077060 A1 and in WO 2005/014689 A2. These are regarded as part of the present invention by way of reference. The further structural units can originate, for example, from the following classes:

group 1: units which influence the hole-injection and/or hole-transport properties of the polymers;
group 2: units which influence the electron-injection and/or electron-transport properties of the polymers;
group 3: units which have combinations of individual units from group 1 and group 2;
group 4: units which modify the emission characteristics to such an extent that electrophosphorescence can be obtained instead of electrofluorescence;
group 5: units which improve transfer from the singlet state to the triplet state;
group 6: units which influence the emission colour of the resultant polymers;
group 7: units which are typically used as polymer backbone;
group 8: units which influence the film morphology and/or the rheological properties of the resultant polymers.

Preferred polymers according to the invention are those in which at least one structural unit has charge-transport properties, i.e. which contain units from group 1 and/or 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles.

Preferred structural units from group 1 are the structural units of the following formulae (1a) to (1q):

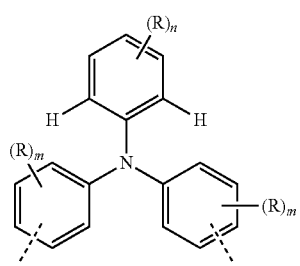
(1a)

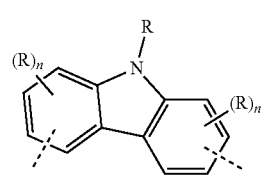
(1b)

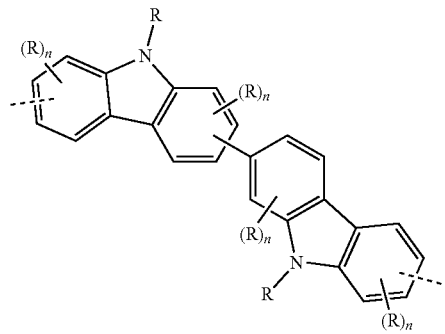
(1c)

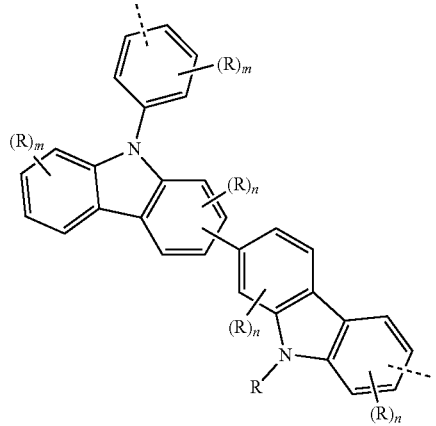
(1d)

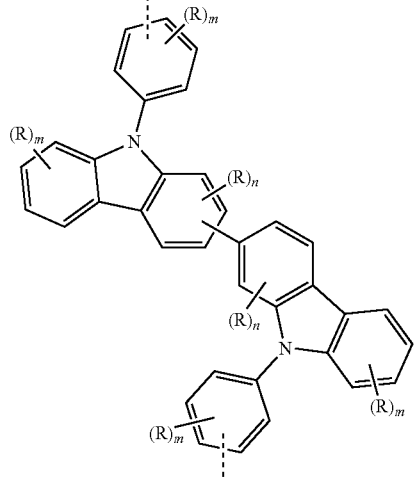
(1e)

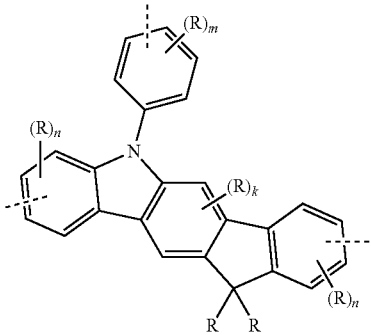
(1f)

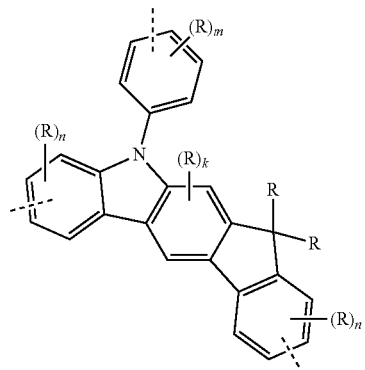
(1g)
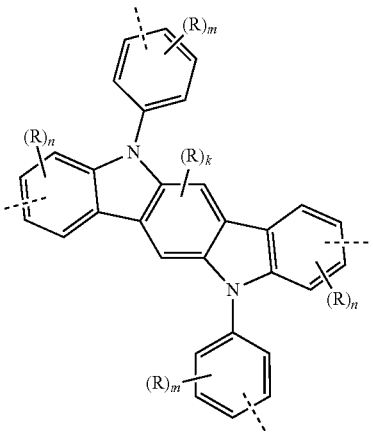
(1h)
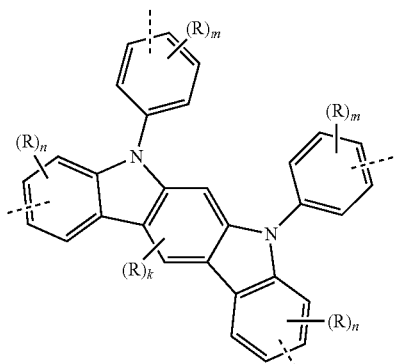
(1i)
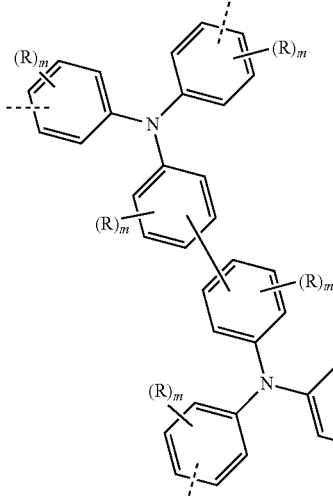
(1j)
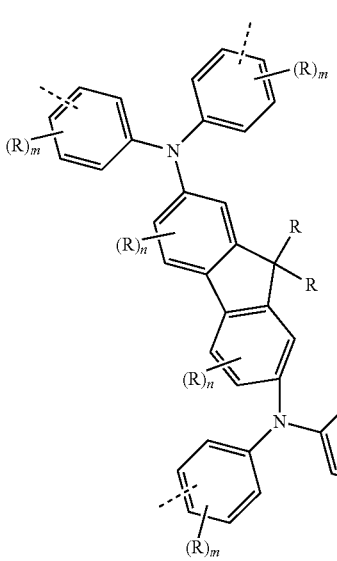
(1k)
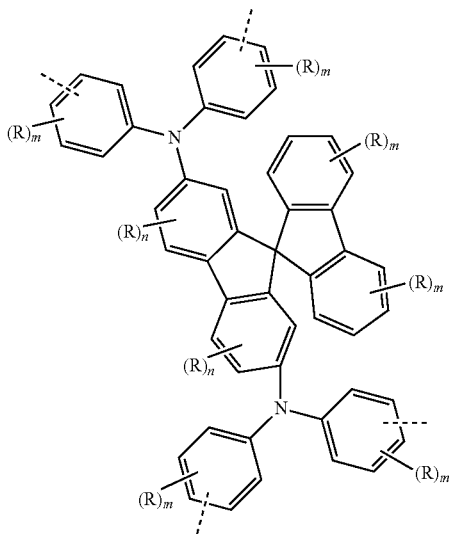
(1m)

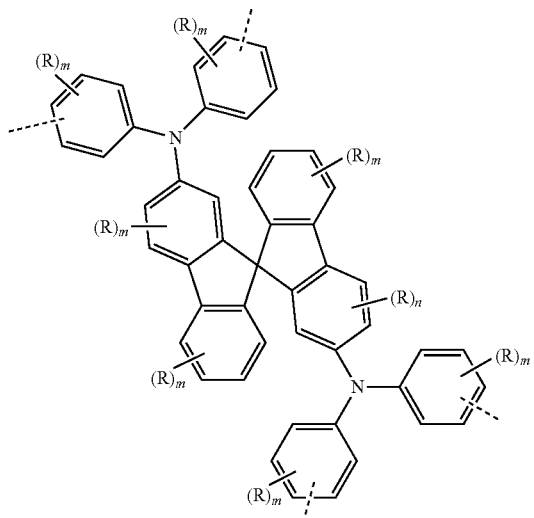

(1n)

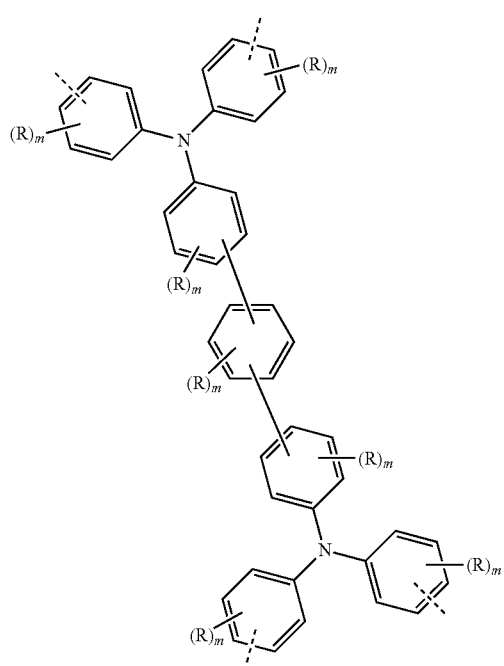

(1p)

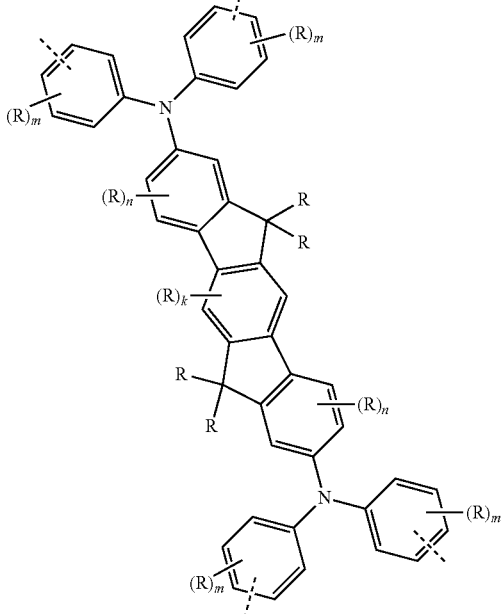

(1q)

where R, k, m and n can adopt the meanings indicated above.

In the formulae (1a) to (1q), the dashed lines represent possible bonds to the adjacent structural units in the polymer. If two dashed lines are present in the formulae, the structural unit has one or two, preferably two, bonds to adjacent structural units. If three dashed lines are present in the formulae, the structural unit has one, two or three, preferably two, bonds to adjacent structural units. If four dashed lines are present in the formulae, the structural unit has one, two, three or four, preferably two, bonds to adjacent structural units. They can be arranged here, independently of one another, identically or differently, in the ortho-, meta- or para-position.

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triaryiboranes and further O-, S- or N-containing heterocycles.

It may be preferred for the polymers according to the invention to contain units from group 3 in which structures which influence the hole mobility and structures which increase the electron mobility (i.e. units from group 1 and 2) are bonded directly to one another or to contain structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units of group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements of groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

Structural units of group 5 are those which improve transfer from the singlet state to the triplet state and which, employed in support of the structural elements of group 4, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units of group 6, besides those mentioned above, are those which have at least one further aromatic structure or another conjugated structure which do not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms or also tolan, stilbene or bisstyrylarylene derivatives, each of which may be substituted by one or more radicals R. Particular preference is given here to the incorporation of 1,4- or 9,10-anthrylene, 1,6-, 2,7- or 4,9-pyrenylene, 3,9- or 3,10-perylenylene, 4,4'-tolanylene, 4,4'-stilbenylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units of group 7 are units which contain aromatic structures having 6 to 40 C atoms, which are typically used as polymer backbone. These are, for example, 4,5-dihydropyrene derivatives, 4,5,9,10-tetrahydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives, but also 1,2-, 1,3- or 1,4-phenylene, 1,2-, 1,3- or 1,4-naphthylene, 2,2'-, 3,3'- or 4,4'-biphenylylene, 2,2''-, 3,3''- or 4,4''-terphenylylene, 2,2'-, 3,3'- or 4,4'-bi-1,1'-naphthylylene or 2,2'''-, 3,3'''- or 4,4'''-quaterphenylylene derivatives.

Preferred structural units from group 7 are the structural units of the following formulae (7a) to (7o).

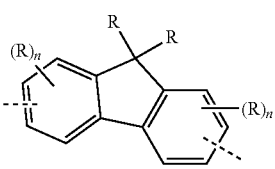
(7a)

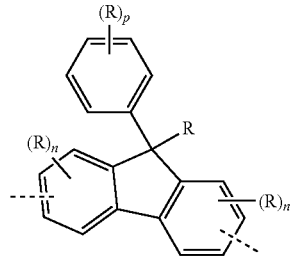
(7b)

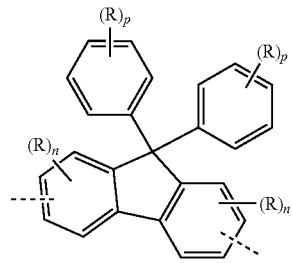
(7c)

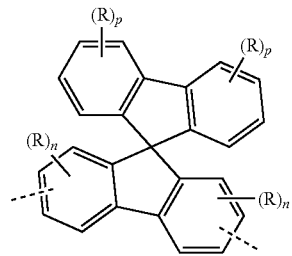
(7d)

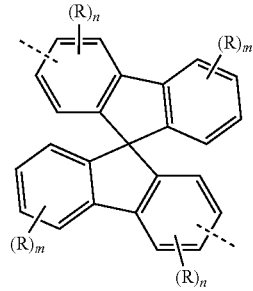
(7e)

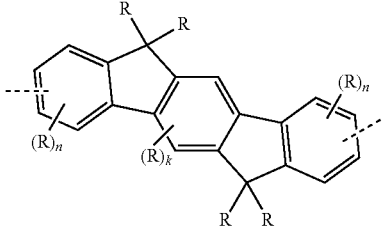
(7f)

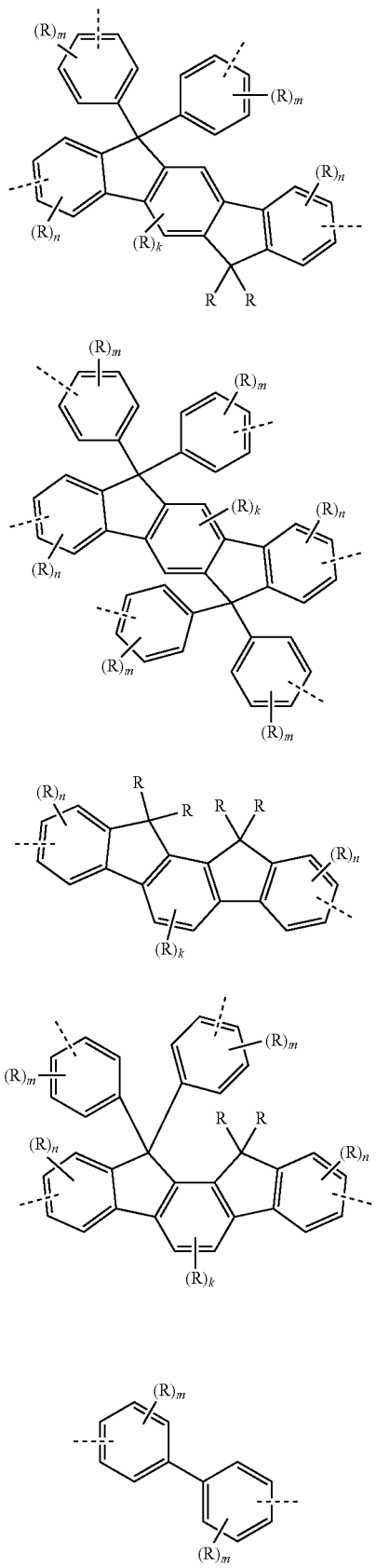
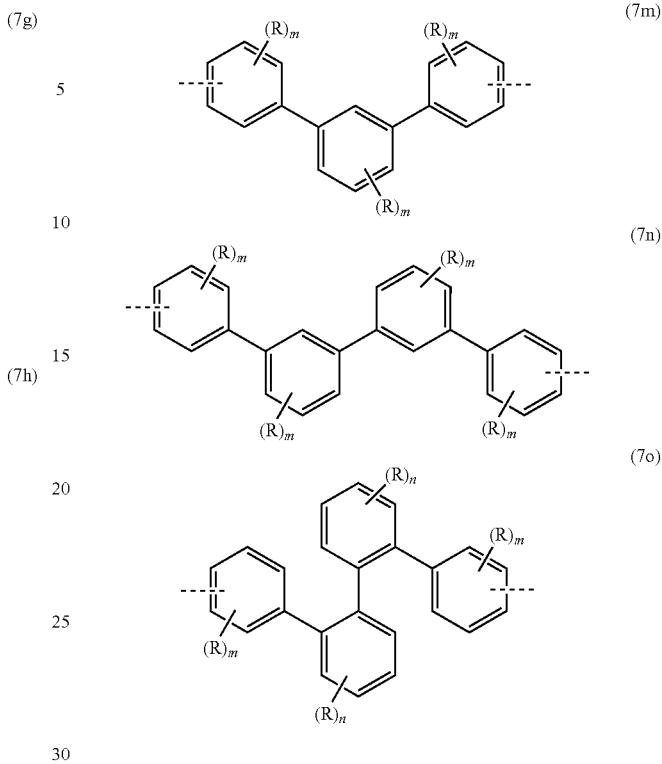

where R, k, m, n and p can adopt the meanings indicated above.

In the formulae (7a) to (7o), the dashed lines represent possible bonds to the adjacent structural units in the polymer. If two dashed lines are present in the formulae, the structural unit has one or two, preferably two, bonds to adjacent structural units. If four or more dashed lines are present in the formulae (formulae (7g), (7h) and (7j)), the structural units have one, two, three or four, preferably two, bonds to adjacent structural units. They can be arranged here, independently of one another, identically or differently, in the ortho-, meta- or para-position.

Structural units of group 8 are those which influence the film morphology and/or the rheological properties of the polymers, such as, for example, siloxanes, alkyl chains or fluorinated groups, but also particularly rigid or flexible units, liquid-crystal-forming units or crosslinkable groups.

Preference is given to polymers according to the invention which simultaneously, besides structural units of the formula (I), (II), (III), (IV), (V), (VI), (VII), (VIII), (IX) and/or (X), additionally also contain one or more units selected from groups 1 to 8. It may likewise be preferred for more than one further structural unit from a group to be present simultaneously.

Preference is given here to polymers according to the invention which, besides at least one structural unit of the formula (I), (II), (III), (IV), (V), (VI), (VII), (VIII), (IX) and/or (X), also contain units from group 7.

It is likewise preferred for the polymers according to the invention to contain units which improve the charge transport or the charge injection, i.e. units from group 1 and/or 2.

It is furthermore particularly preferred for the polymers according to the invention to contain structural units from group 7 and units from group 1 and/or 2.

The polymers according to the invention are either homopolymers comprising structural units of the formula (I), (II), (III), (IV), (V), (VI), (VII), (VII), (IX) or (X) or copolymers. The polymers according to the invention may be linear or branched, preferably linear. Copolymers according to the invention may, besides one or more structural units of the formula (I), (II), (III), (IV), (V), (VI), (VII), (VIII), (IX) and/or (X), potentially have one or more further structures from the above-mentioned groups 1 to 8.

The copolymers according to the invention can contain random, alternating or block-like structures or also have a plurality of these structures in an alternating manner. The copolymers according to the invention particularly preferably contain random or alternating structures. The copolymers are particularly preferably random or alternating copolymers. The way in which copolymers having block-like structures can be obtained and what further structural elements are particularly preferred for this purpose is described, for example, in detail in WO 2005/014688 A2. This is part of the present application by way of reference. It should likewise again be emphasised at this point that the polymer may also have dendritic structures.

In a further embodiment of the present invention, the polymers according to the invention, besides one or more structural units of the formula (I), (II), (III), (IV), (V), (VI), (VII), (VIII), (IX) and/or (X) and optionally further structural units selected from the above-mentioned groups 1 to 8, also contain at least one, preferably one, structural unit which contains a crosslinkable group Q.

"Crosslinkable group Q" in the sense of the present invention denotes a functional group which is capable of undergoing a reaction and thus forming an insoluble compound. The reaction here can take place with a further, identical group Q, a further, different group Q or any desired other part thereof or another polymer chain. The crosslinkable group is thus a reactive group. A correspondingly crosslinked compound is obtained here as a result of the reaction of the crosslinkable group. The chemical reaction can also be carried out in the layer, where an insoluble layer forms. The crosslinking can usually be supported by heat or by UV, microwave, X-ray or electron radiation, optionally in the presence of an initiator. "Insoluble" in the sense of the present invention preferably means that the polymer according to the invention after the crosslinking reaction, i.e. after the reaction of the crosslinkable groups, has a solubility at room temperature in an organic solvent which is at least a factor of 3, preferably at least a factor of 10, lower than that of the corresponding uncrosslinked polymer according to the invention in the same organic solvent.

The structural unit which carries the crosslinkable group Q can, in a first embodiment, be selected from the structural units of the formula (I), (II), (III), (IV), (V), (VI), (VII), (VIII), (IX) and/or (X).

Preferred structural units which carry the crosslinkable group Q are the following structural units of the formulae (XIa1) to (XIa3) derived from the structural unit of the formula (Ia):

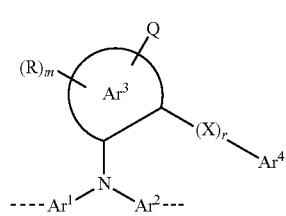

(XIa1)

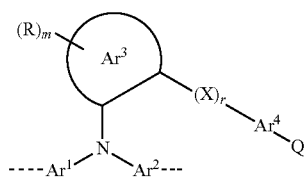

(XIa2)

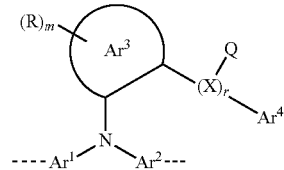

(XIa3)

where $Ar^1$, $Ar^2$, $Ar^3$, $Ar^4$, R, m, X and r can adopt the meanings indicated above in relation to formula (Ia).

Examples of preferred structural units of the formula (XIa) are depicted in the following table:

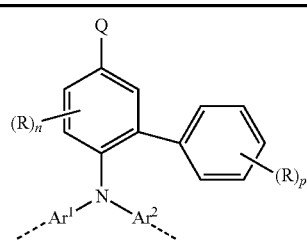

(11a)

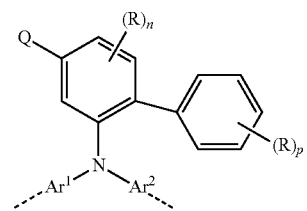

(11b)

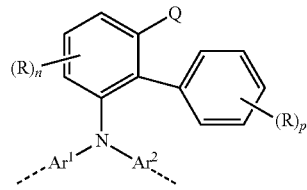

(11c)

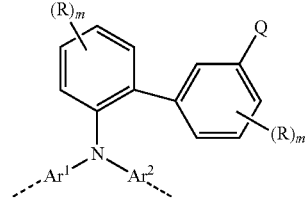

(11d)

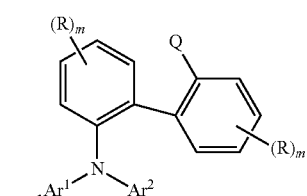

(11e)

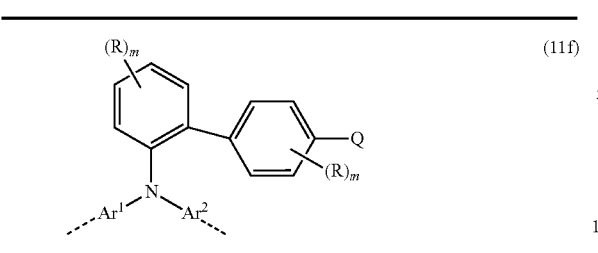

where R, k, m, n and p can adopt the meanings indicated above.

In the formulae (11a) to (11f), the dashed lines represent possible bonds to the adjacent structural units in the polymer. If two dashed lines are present in the formulae, the structural unit has one or two, preferably two, bonds to adjacent structural units.

Further preferred structural units which carry the cross-linkable group Q are the following structural units of the formulae (XIb1) to (XI1b4) derived from the structural unit of the formula (Ib).

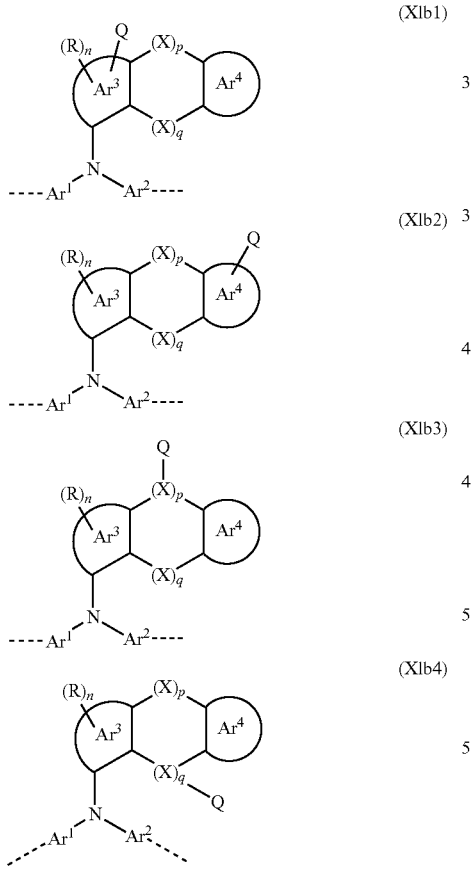

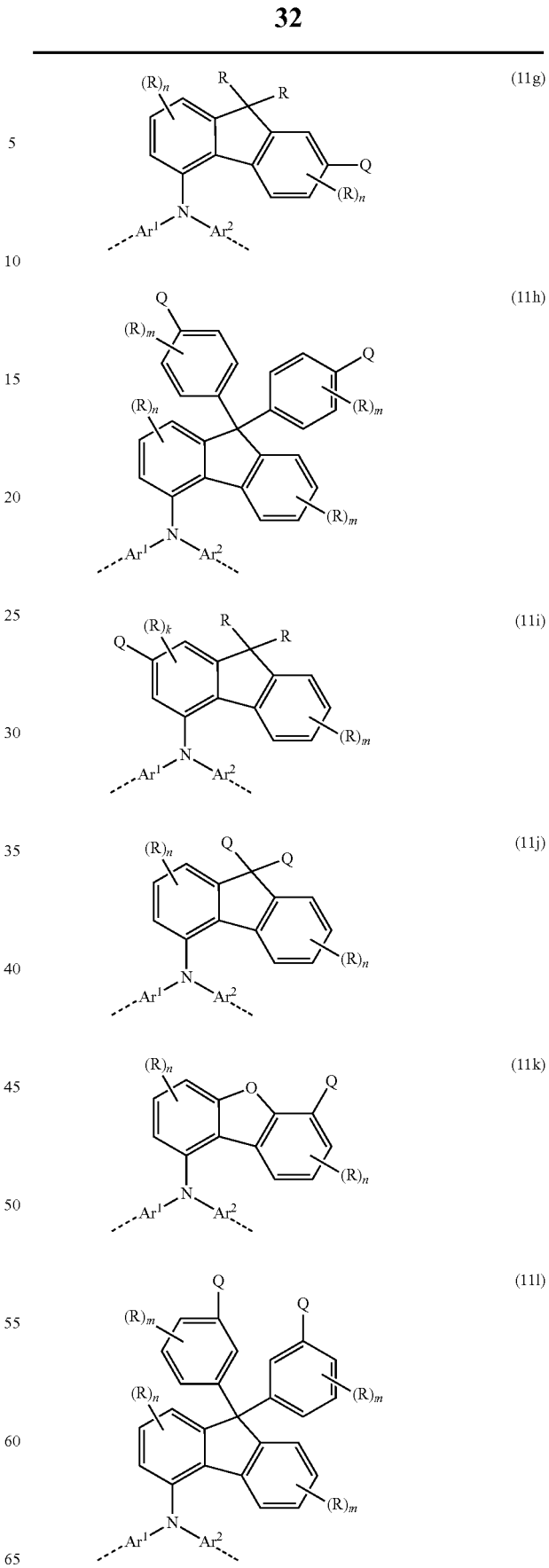

where $Ar^1$, $Ar^2$, $Ar^3$, $Ar^4$, R n. X, p and q can adopt the meanings indicated above in relation to formula (Ib).

Examples of preferred structural units of the formula (XIb) are depicted in the following table:

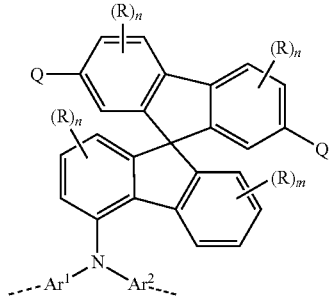

(11m)

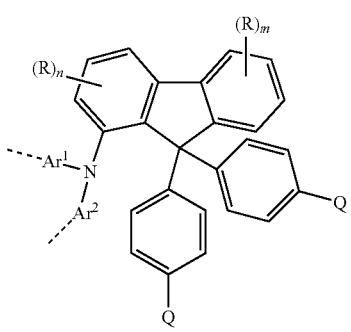

(11n)

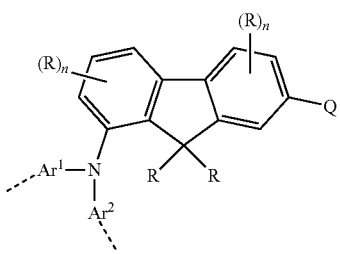

(11o)

where R, k, m, n and p can adopt the meanings indicated above.

In the formulae (11g) to (11o), the dashed lines represent possible bonds to the adjacent structural units in the polymer. If two dashed lines are present in the formulae, the structural unit has one or two, preferably two, bonds to adjacent structural units.

Furthermore, the structural unit which carries the crosslinkable group Q can, in a second embodiment, be selected from the structural units disclosed in groups 1 to 8.

A preferred structural unit which carry the crosslinkable group Q is the following structural unit of the formula (XII), which is derived from the triarylamine units of group 1:

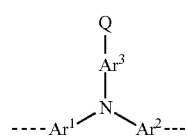

(XII)

where $Ar^1$, $Ar^2$ and $Ar^3$ can adopt the meanings indicated above in relation to formula (I).

Examples of preferred structural units of the formula (XII) are depicted in the following table:

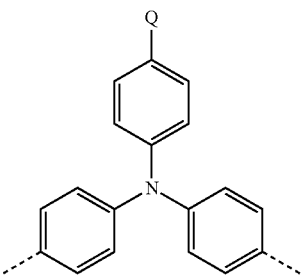

(12a)

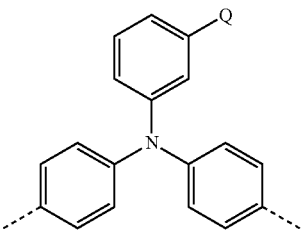

(12b)

A further preferred structural unit which carry the crosslinkable group Q is the following structural unit of the formula (XIII), which is derived from group 7:

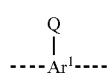

(XIII)

where $Ar^1$ can adopt the meanings indicated in relation to the structural unit of the formula (I).

Examples of preferred structural units of the formula (XIII) are depicted in the following table:

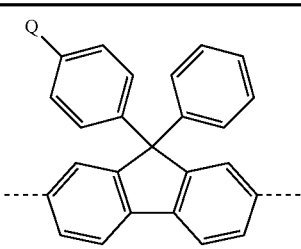

(13a)

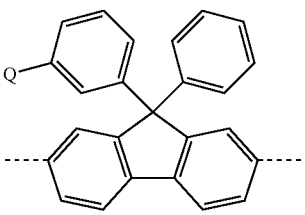

(13b)

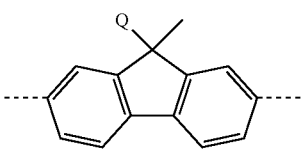

(13c)

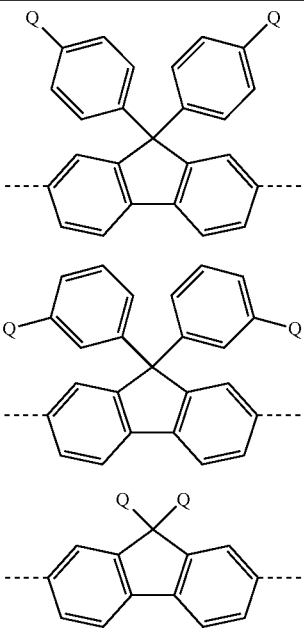

As described above, the crosslinkable group Q is a functional group which is capable of undergoing a chemical reaction and thus forming an insoluble polymeric compound. In general, all groups Q which are known to the person skilled in the art for this purpose can be employed. The task of this group is, in particular, to link the polymeric compounds according to the invention to one another, optionally to further reactive polymeric compounds, by a crosslinking reaction. This results in a crosslinked compound, or, if the reaction is carried out in a layer, in a crosslinked layer. A crosslinked layer in the sense of the present invention is taken to mean a layer which is obtainable by carrying out the crosslinking reaction from a layer of the crosslinkable, polymeric compound according to the invention. The crosslinking reaction can in general be initiated by heat and/or by UV, microwave, X-ray or electron radiation and/or by the use of free-radical formers, anions, cations, acids and/or photoacids. The presence of catalysts may likewise be helpful or necessary. The crosslinking reaction is preferably a reaction for which no initiator and no catalyst has to be added.

Crosslinkable groups Q which are preferred in accordance with the invention are the groups mentioned below:

a) Terminal or Cyclic Alkenyl or Terminal Dienyl and Alkynyl Groups:

Suitable units are those which contain a terminal or cyclic double bond, a terminal dienyl group or a terminal triple bond, in particular terminal or cyclic alkenyl, terminal dienyl or terminal alkynyl groups having 2 to 40 C atoms, preferably having 2 to 10 C atoms, where individual $CH_2$ groups and/or individual H atoms may also be replaced by the above-mentioned groups R. Furthermore suitable are also groups which are to be regarded as precursors and are capable of the in-situ formation of a double or triple bond.

b) Alkenyloxy, Dienyloxy or Alkynyloxy Groups:

Furthermore suitable are alkenyloxy, dienyloxy or alkynyloxy groups, preferably alkenyloxy groups.

c) Acrylic Acid Groups:

Furthermore suitable are acrylic acid units in the broadest sense, preferably acrylates, acrylamides, methacrylates and methacrylamides. $C_{1-10}$-alkyl acrylate and $C_{1-10}$-alkyl methacrylate are particularly preferred.

The crosslinking reaction of the groups mentioned above under a) to c) can take place via a free-radical, cationic or anionic mechanism, but also via cycloaddition.

It may be helpful to add a corresponding initiator for the crosslinking reaction. Suitable initiators for free-radical crosslinking are, for example, dibenzoyl peroxide, AIBN or TEMPO. Suitable initiators for cationic crosslinking are, for example, $AlCl_3$, $BF_3$, triphenylmethyl perchlorate or tropylium hexachloroantimonate. Suitable initiators for anionic crosslinking are bases, in particular butyllithium.

In a preferred embodiment of the present invention, however, the crosslinking is carried out without the addition of an initiator and is initiated exclusively thermally. This preference is due to the fact that the absence of the initiator prevents contamination of the layer, which could result in impairment of the device properties.

d) Oxetanes and Oxiranes:

A further suitable class of crosslinkable groups Q are oxetanes and oxiranes, which crosslink cationically by ring opening.

It may be helpful to add a corresponding initiator for the crosslinking reaction. Suitable initiators are, for example, $AlCl_3$, $BF_3$, triphenylmethyl perchlorate or tropylium hexachloroantimonate. Photoacids can likewise be added as initiators.

e) Silanes:

Furthermore suitable as a class of crosslinkable groups are silane groups $SiR_3$, where at least two groups R, preferably all three groups R, stand for Cl or an alkoxy group having 1 to 20 C atoms.

This group reacts in the presence of water to give an oligo- or polysiloxane.

f) Cyclobutane Groups

The above-mentioned crosslinkable groups Q are generally known to the person skilled in the art, as are the suitable reaction conditions which are used for the reaction of these groups.

Preferred crosslinkable groups Q include alkenyl groups of the following formula Q1, dienyl groups of the following formula Q2, alkynyl groups of the following formula Q3, alkenyloxy groups of the following formula Q4, dienyloxy groups of the following formulae Q5, alkynyloxy groups of the following formula Q6, acrylic acid groups of the following formulae Q7 and Q8, oxetane groups of the following formulae Q9 and Q10, oxirane groups of the following formula Q11 and cyclobutane groups of the following formula Q12:

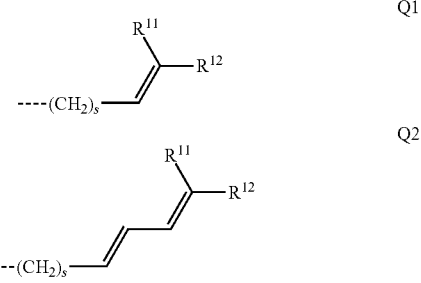

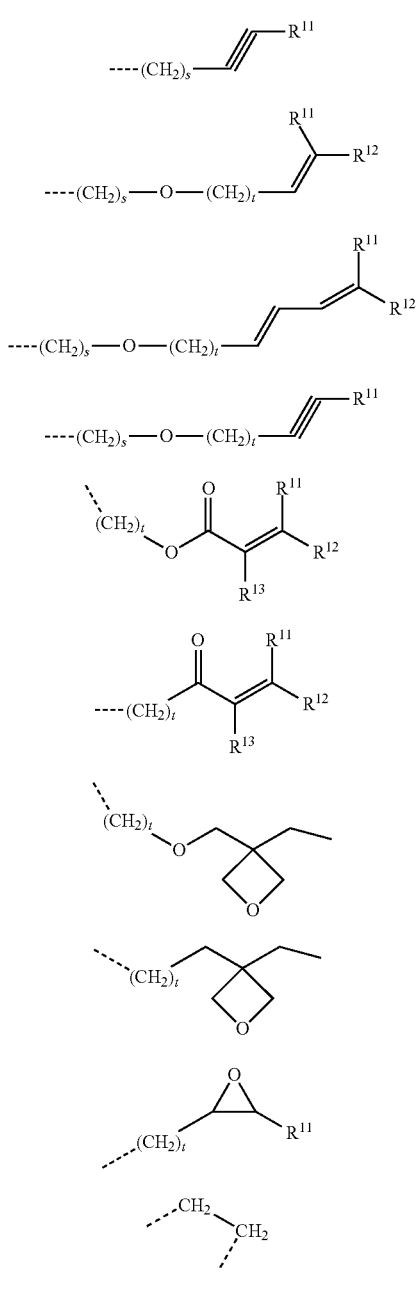
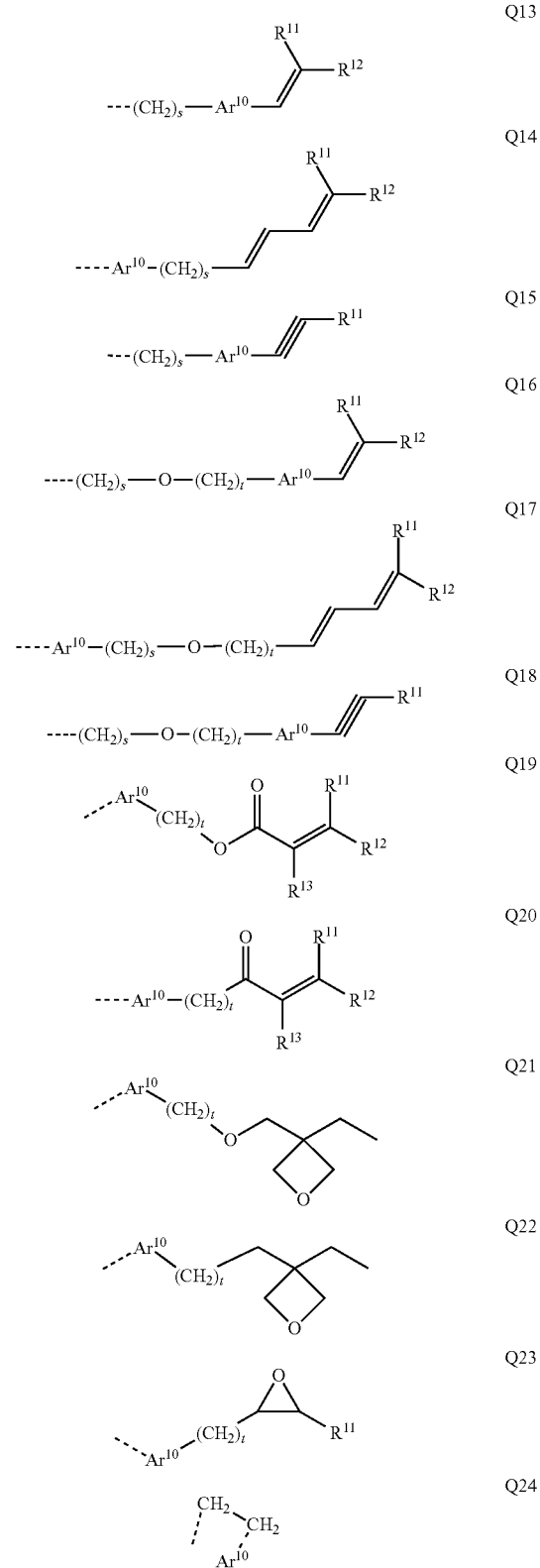

The radicals $R^{11}$, $R^{12}$ and $R^{13}$ in the formulae Q1 to Q8 and Q11 are on each occurrence, identically or differently, H, a straight-chain or branched alkyl group having 1 to 6 C atoms, preferably 1 to 4 C atoms. The radicals $R^{11}$, $R^{12}$ and $R^{13}$ are particularly preferably H, methyl, ethyl, n-propyl, isopropyl, n-butyl, sec-butyl or tert-butyl and very particularly preferably H or methyl. The indices used have the following meaning: s=0 to 8; and t=1 to 8.

The dashed bond in the formulae Q1 to Q11 and the dashed bonds in the formula Q12 represent the linking of the crosslinkable group to the structural units.

The crosslinkable groups of the formulae Q1 to Q12 may be linked directly to the structural unit, or else indirectly, via a further mono- or polycyclic, aromatic or heteroaromatic ring system $Ar^{10}$, as depicted in the following formulae Q13 to Q24:

where $Ar^{10}$ in the formulae Q13 to Q24 can adopt the same meanings as $Ar^1$.

Particularly preferred crosslinkable groups Q are the following

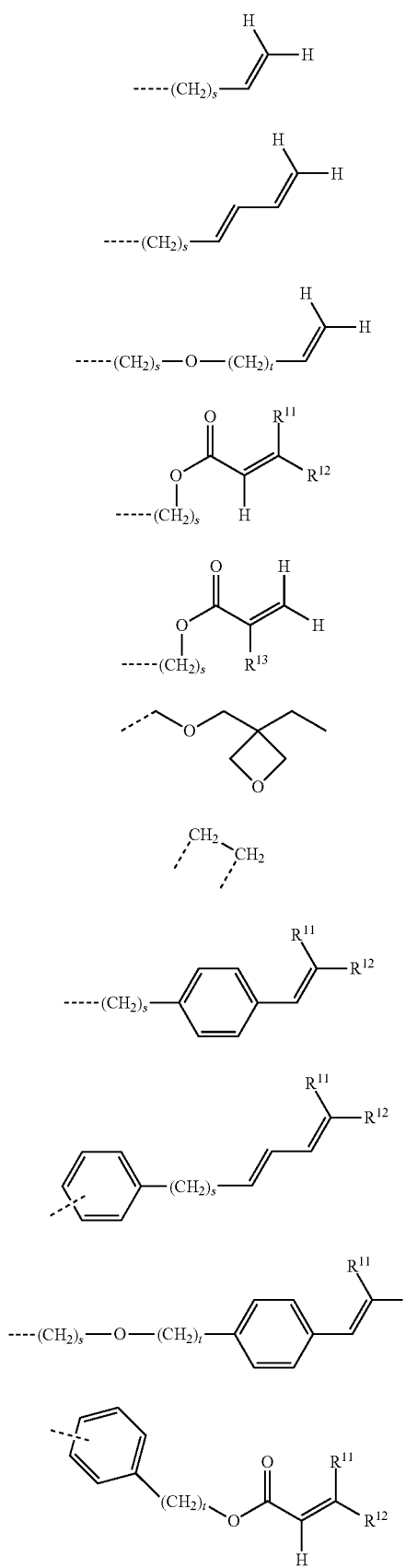

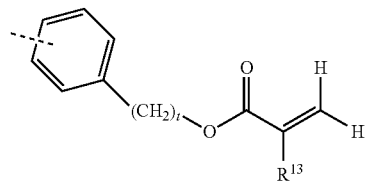

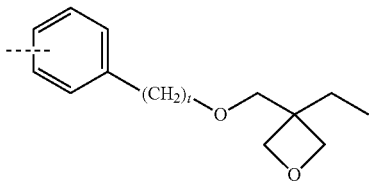

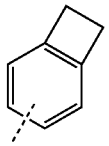

The radicals $R^{11}$ and $R^{12}$ in the formulae Q7a and Q13a to Q19a are on each occurrence, identically or differently, H or a straight-chain or branched alkyl group having 1 to 6 C atoms, preferably 1 to 4 C atoms. The radicals $R^{11}$ and $R^{12}$ are particularly preferably methyl, ethyl, n-propyl, isopropyl, n-butyl, sec-butyl or tert-butyl and very particularly preferably methyl.

The radical $R^{13}$ in the formulae Q7b and Q19b is on each occurrence a straight-chain or branched alkyl group having 1 to 6 C atoms, preferably 1 to 4 C atoms. The radical $R^{13}$ is particularly preferably methyl, ethyl, n-propyl, isopropyl, n-butyl, sec-butyl or tert-butyl and very particularly preferably methyl.

The indices used have the following meaning: s=0 to 8 and t=1 to 8.

Very particularly preferred crosslinkable groups Q are the following:

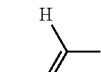

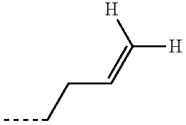

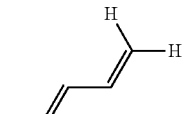

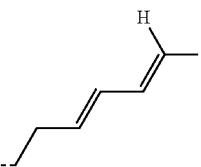

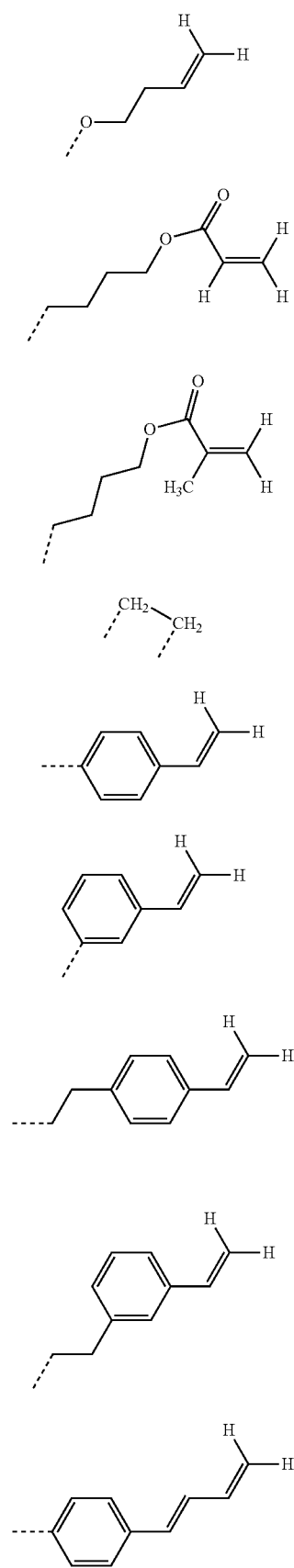
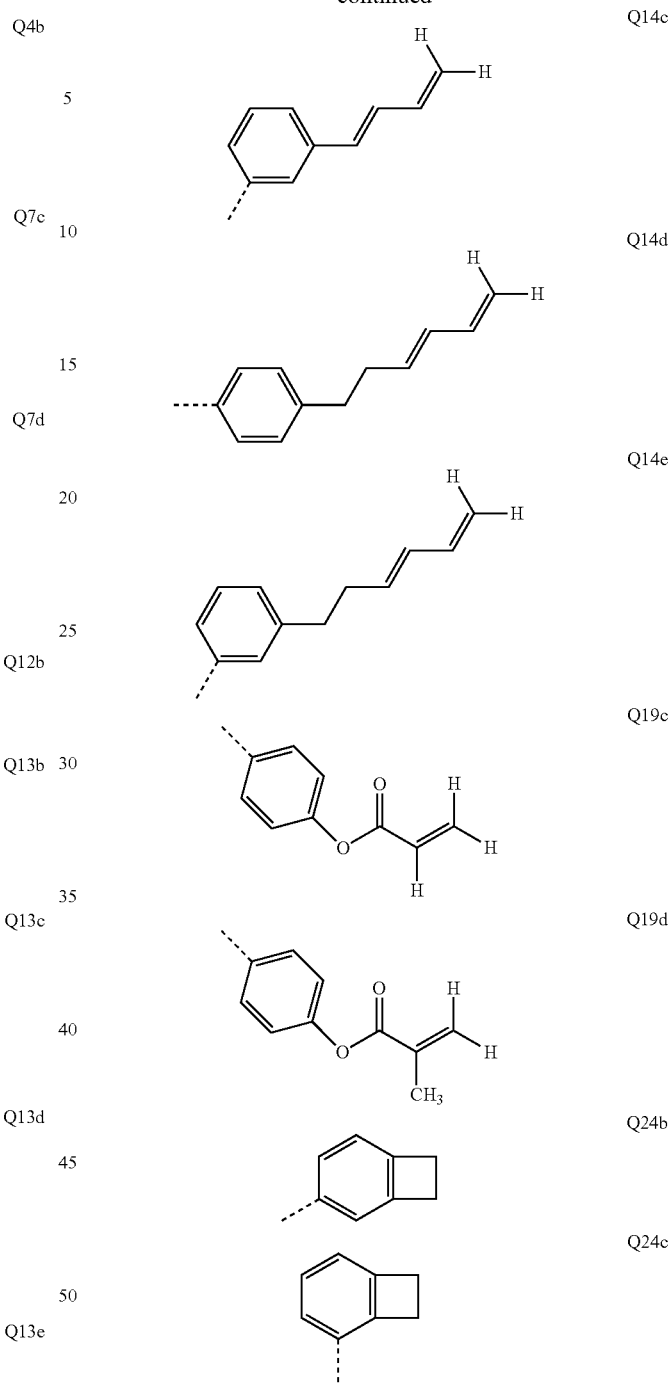

In the preferred groups Q1 to Q24, in the particularly preferred groups Q1a to Q24a and in the very particularly preferred groups Q1b to Q24c, the dashed lines represent the bonds to the structural units. It should be noted in this connection that the groups Q12, Q12a, Q12b and Q24 each have two bonds to two adjacent ring carbon atoms of the structural unit. All other crosslinkable groups have only one bond to the structural unit.

The proportion of crosslinkable structural units in the polymer is in the range from 0.01 to 50 mol %, preferably in the range from 0.1 to 30 mol %, particularly preferably in the range from 0.5 to 25 mol % and very particularly preferably in the range from 1 to 20 mol %, based on 100 mol % of all copolymerised monomers present as structural units in the polymer.

The polymers according to the invention containing structural units of the formula (I), (II), (III), (IV), (V), (VI), (VII), (VIII), (IX), (X) and/or (XI) are generally prepared by polymerisation of one or more types of monomer, at least one monomer of which results in structural units of the formula (I), (II), (III), (IV), (V), (VI), (VII), (VIII), (IX), (X) and/or (XI) in the polymer. Suitable polymerisation reactions are known to the person skilled in the art and are described in the literature. Particularly suitable and preferred polymerisation reactions which result in C—C or C—N links are the following:

(A) SUZUKI polymerisation;
(B) YAMAMOTO polymerisation;
(C) STILLE polymerisation;
(D) HECK polymerisation;
(E) NEGISHI polymerisation;
(F) SONOGASHIRA polymerisation;
(G) HIYAMA polymerisation; and
(H) HARTWIG-BUCHWALD polymerisation.

The way in which the polymerisation can be carried out by these methods and the way in which the polymers can then be separated off from the reaction medium and purified is known to the person skilled in the art and is described in detail in the literature, for example in WO 03/048225 A2, WO 2004/037887 A2 and WO 2004/037887 A2.

The C—C linking reactions are preferably selected from the groups of SUZUKI coupling, YAMAMOTO coupling and STILLE coupling; the C—N linking reaction is preferably a HARTWIG-BUCHWALD coupling.

The present invention thus also relates to a process for the preparation of the polymers according to the invention, which is characterised in that they are prepared by SUZUKI polymerisation, YAMAMOTO polymerisation, STILLE polymerisation or HARTWIG-BUCHWALD polymerisation.

For the synthesis of the polymers according to the invention, the corresponding monomers of the formula (MI) are required.

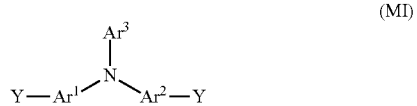

(MI)

where $Ar^1$, $Ar^2$ and $Ar^3$ can adopt the meanings indicated in relation to the structural unit of the formula (I).

The monomers of the formula (MI) which lead to structural units of the formula (I) in the polymers according to the invention are compounds which are correspondingly substituted and have at two positions suitable functionalities which allow this monomer unit to be incorporated into the polymer. The present invention thus likewise relates to these monomers of the formula (MI). The group Y represents, identically or differently, a leaving group which is suitable for a polymerisation reaction, so that the incorporation of the monomer units into polymeric compounds is facilitated. Y preferably represents a chemical functionality which is selected, identically or differently, from the class of the halogens, O-tosylates, O-triflates, O-sulfonates, boric acid esters, partially fluorinated silyl groups, diazonium groups and organotin compounds.

The basic structure of the monomer compounds can be functionalised by standard methods, for example by Friedel-Crafts alkylation or acylation. Furthermore, the basic structure can be halogenated by standard methods of organic chemistry. The halogenated compounds can optionally be reacted further in additional functionalisation steps. For example, the halogenated compounds can be employed, either directly or after conversion into a boronic acid derivative or organotin derivative, as starting materials for the reaction to give polymers, oligomers or dendrimers.

The said methods merely represent a selection from the reactions known to the person skilled in the art which the latter can employ, without being inventive, for the synthesis of the compounds according to the invention.

The polymers according to the invention can be used as pure substance, but also as mixture together with any desired further polymeric, oligomeric, dendritic or low-molecular-weight substances. Low-molecular-weight substance in the present invention is taken to mean compounds having a molecular weight in the range from 100 to 3000 g/mol, preferably 200 to 2000 g/mol. These further substances may, for example, improve the electronic properties or themselves emit. Mixture above and below denotes a mixture comprising at least one polymeric component. In this way, one or more polymer layers consisting of a mixture (blend) of one or more polymers according to the invention containing a structural unit of the formula (I), (II), (III), (IV), (V), (VI), (VII), (VIII), (IX) and/or (X) and optionally one or more further polymers can be prepared using one or more low-molecular-weight substances.

The present invention thus furthermore relates to a polymer blend comprising one or more polymers according to the invention, and one or more further polymeric, oligomeric, dendritic and/or low-molecular-weight substances.

The invention furthermore relates to solutions and formulations comprising one or more polymers according to the invention or a polymer blend in one or more solvents. The way in which such solutions can be prepared is known to the person skilled in the art and is described, for example, in WO 02/072714 A1, WO 03/019694 A2 and the literature cited therein.

These solutions can be used in order to produce thin polymer layers, for example by surface-coating methods (for example spin coating) or by printing processes (for example ink-jet printing).

Polymers containing structural units which contain a crosslinkable group Q are particularly suitable for the production of films or coatings, in particular for the production of structured coatings, for example by thermal or light-induced in-situ polymerisation and in-situ crosslinking, such as, for example, in-situ UV photopolymerisation or photo-patterning. It is possible here to use both corresponding polymers in pure substance, but it is also possible to use formulations or mixtures of these polymers as described above. These can be used with or without addition of solvents and/or binders. Suitable materials, processes and devices for the methods described above are described, for example, in WO 2005/083812 A2. Possible binders are, for example, polystyrene, polycarbonate, poly(meth)acrylates, polyacrylates, polyvinylbutyral and similar, opto-electronically neutral polymers.

Suitable and preferred solvents are, for example, toluene, anisole, o-, m- or p-xylene, methyl benzoate, mesitylene, tetralin, veratrol, THF, methyl-THF, THP, chlorobenzene, dioxane, phenoxytoluene, in particular 3-phenoxytoluene, (−)-fenchone, 1,2,3,5-tetramethylbenzene, 1,2,4,5-tetramethylbenzene, 1-methylnaphtalene, 2-methylbenzothiazole, 2-phenoxyethanol, 2-pyrrolidinone, 3-methylanisole, 4-methylanisole, 3,4-dimethylanisole, 3,5-dimethylanisole, acetophenone, α-terpineol, benzothiazole, butyl benzoate, cumene, cyclohexanol, cyclohexanone, cyclohexylbenzene, decalin, dodecylbenzene, ethyl benzoate, indane, methyl benzoate, NMP, p-cymene, phenetole, 1,4-diisopropylbenzene, dibenzyl ether, diethylene glycol butyl methyl ether, triethylene glycol butyl methyl ether, diethylene glycol dibutyl ether, triethylene glycol dimethyl ether, diethylene glycol monobutyl ether, tripropylene glycol dimethyl ether, tetraethylene glycol dimethyl ether, 2-isopropylnaphthalene, pentylbenzene, hexylbenzene, heptylbenzene, octylbenzene, 1,1-bis(3,4-dimethylphenyl)ethane or mixtures of these solvents.

The present invention thus furthermore relates to the use of a polymer which contains structural units which contain a crosslinkable group Q for the preparation of a crosslinked polymer. The crosslinkable group, which is particularly preferably a vinyl group or alkenyl group, is preferably incorporated into the polymer by the WITTIG reaction or a WITTIG-analogous reaction. If the crosslinkable group is a vinyl group or alkenyl group, the crosslinking can take place by free-radical or ionic polymerisation, which can be induced thermally or by radiation. Preference is given to free-radical polymerisation which is induced thermally, preferably at temperatures of less than 250° C. particularly preferably at temperatures of less than 230° C.

An additional styrene monomer is optionally added during the crosslinking process in order to achieve a higher degree of crosslinking. The proportion of the added styrene monomer is preferably in the range from 0.01 to 50 mol %, particularly preferably 0.1 to 30 mol %, based on 100 mol % of all copolymerised monomers which are present as structural units in the polymer.

The present invention thus also relates to a process for the preparation of a crosslinked polymer which comprises the following steps:

(a) provision of polymers which contain structural units which contain one or more crosslinkable groups Q; and (b) free-radical or ionic crosslinking, preferably free-radical crosslinking, which can be induced both thermally and also by radiation, preferably thermally.

The crosslinked polymers prepared by the process according to the invention are insoluble in all common solvents. In this way, it is possible to produce defined layer thicknesses which are not dissolved or partially dissolved again, even by the application of subsequent layers.

The present invention thus also relates to a crosslinked polymer which is obtainable by the process mentioned above. The crosslinked polymer is—as described above—preferably produced in the form of a crosslinked polymer layer. Owing to the insolubility of the crosslinked polymer in all solvents, a further layer can be applied to the surface of a crosslinked polymer layer of this type from a solvent using the techniques described above.

The present invention also encompasses so-called hybrid devices, in which one or more layers which are processed from solution and layers which are produced by vapour deposition of low-molecular-weight substances may occur.

The polymers according to the invention can be used in electronic or opto-electronic devices or for the production thereof.

The present invention thus furthermore relates to the use of the polymers according to the invention in electronic or opto-electronic devices, preferably in organic electroluminescent devices (OLED), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices or organic photoreceptors (OPCs), particularly preferably in organic electroluminescent devices (OLED).

In the case of the hybrid device mentioned above, the term combined PLED/SMOLED (polymeric light emitting diode/small molecule organic light emitting diode) systems is used in connection with organic electroluminescent devices.

The way in which OLEDs can be produced is known to the person skilled in the art and is described in detail, for example, as a general process in WO 2004/070772 A2, which should be adapted correspondingly for the individual case.

As described above, the polymers according to the invention are very particularly suitable as electroluminescent materials in OLEDs or displays produced in this way.

Electroluminescent materials in the sense of the present application are regarded as being materials which can be used as active layer. Active layer means that the layer is capable of emitting light on application of an electric field (light-emitting layer) and/or that it improves the injection and/or transport of positive and/or negative charges (charge-injection or charge-transport layer).

The present invention therefore preferably also relates to the use of the polymers according to the invention in OLEDs, in particular as electroluminescent material.

The present invention furthermore relates to electronic or opto-electronic components, preferably organic electroluminescent devices (OLED), organic field-effect transistors (OFETs), organic integrated circuits (O-ICs), organic thin-film transistors (TFTs), organic solar cells (O-SCs), organic laser diodes (O-lasers), organic photovoltaic (OPV) elements or devices and organic photoreceptors (OPCs), particularly preferably organic electroluminescent devices, having one or more active layers, where at least one of these active layers comprises one or more polymers according to the invention. The active layer can be, for example, a light-emitting layer, a charge-transport layer and/or a charge-injection layer.

The present application text and also the examples below are principally directed to the use of the polymers according to the invention in relation to OLEDs and corresponding displays. In spite of this restriction of the description, it is possible for the person skilled in the art, without further inventive step, also to use the polymers according to the invention as semiconductors for the further uses described above in other electronic devices.

The following examples are intended to explain the invention without restricting it. In particular, the features, properties and advantages described therein of the defined compounds on which the relevant example is based can also be applied to other compounds which are not described in detail, but fall within the scope of protection of the claims, unless stated otherwise elsewhere.

EXAMPLES

Part A: Synthesis of the Monomers

All syntheses are carried out in an argon atmosphere and in dry solvents, unless described otherwise.

A1 Preparation of Precursors

A1.1 Preparation of 3-chloro-3,7-dimethyloctane

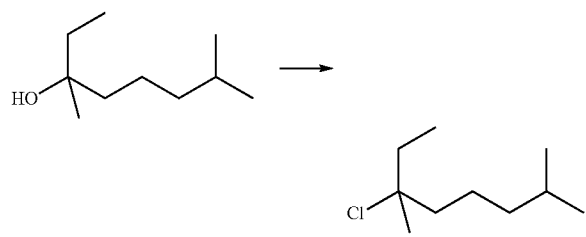

100 ml (522 mmol) of 3,7-dimethyloctanol (CAS 78-69-3) are initially introduced, 0.2 ml (2 mmol) of pyridine is added, and the mixture is cooled to −5° C. 45.6 ml (628 mmol) of thionyl chloride are added dropwise with stirring at such a rate that the temperature does not exceed 5° C. HCl and $SO_2$ gas formed is expelled from the apparatus using a stream of argon and discharged via a scrubbing tower. When the addition is complete, the mixture is stirred for 2 hours, the cooling is then removed, and the mixture is stirred for a further 12 hours. Firstly, excess thionyl chloride is distilled off via a Vigreux column (length about 10 cm) at room temperature under reduced pressure. Then, the product is subjected to fractional distillation at 2 mbar and a head temperature of 60 to 65° C., giving 88.9 g (96% of theory) of the product as colourless oil.

A1.2 Preparation of the Alkylated Aromatic Compounds Alk1 to Alk4

Alkylated aromatic compounds are prepared by means of Friedel-Crafts reaction by the processes A and B described by way of example below.

Process A

Alkylation using t-butyl chloride to give 4,4'-di-t-butylbiphenyl (Alk1)

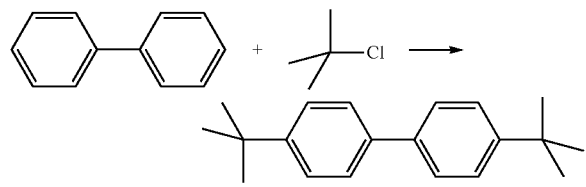

613 g of biphenyl (3.975 mol) are dissolved in 2.5 l of dichloromethane, and 24.5 g (0.15 mol) of iron(III) chloride are added. 1227 ml of t-butyl chloride (11.130 mol) are added dropwise over the course of 3 hours at room temperature with vigorous stirring. During this addition, HCl gas formed is expelled from the apparatus using a stream of argon and discharged via a scrubbing tower. When the addition is complete, the mixture is heated under reflux for 4 hours. The heating is then removed, and the mixture is stirred for a further 12 hours. The mixture is filtered through about 750 g of silica gel, which is then washed with about 500 ml of dichloromethane. The yellow solution is completely freed from the solvent in a rotary evaporator, the orange solid which remains is washed by stirring with about 2 l of ethanol at 60° C. The mixture is cooled at 0° C. for 1 hour, the solid is then filtered off with suction and washed twice with 300 ml of cold ethanol each time. After drying in a vacuum drying cabinet, 827 g (78% of theory) remain as pale-yellow crystalline solid.

Process B

Alkylation using 3-chloro-3,7-dimethyloctane to give di(3, 7-dimethyloctan-3-yl)biphenyl (Alk2)

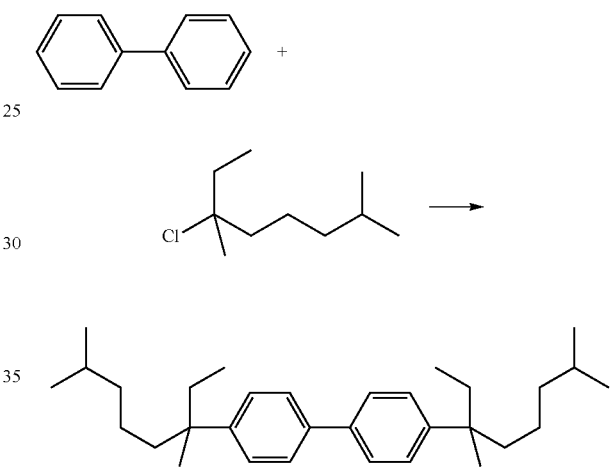

24.7 g (160 mmol) of biphenyl and 26.0 g (160 mmol) of iron(III) chloride are initially introduced without solvent, mixed using a precision glass stirrer. 85.0 g (480 mmol) of 6-chloro-3,7-dimethyloctane are added dropwise over the course of 30 minutes with cooling using an ice bath, where the mixture increasingly becomes easier to stir. During this addition, HCl gas formed is expelled from the apparatus using a stream of argon and discharged via a scrubbing tower. When the addition is complete, the mixture is stirred for a further 4 hours, and about 100 ml of heptane are then added. The suspension is filtered through about 30 g of silica gel, which is then washed with about 500 ml of heptane. The pale-yellow solution is completely freed from the solvent in a rotary evaporator, leaving a yellow oil. This is freed from excess 3-chloro-3,7-dimethyloctane and monosubstituted biphenyl via a distillation bridge without cooling at $10^2$ mbar and a head temperature of up to 170° C. Small amounts of unreacted biphenyl may sometimes also crystallise in the bridge. 54.9 g (79% of theory as isomer mixture) remain in the still as yellow oil.

A GC-MS analysis of Alk2 shows three compounds in the ratio of about 60:35:5 area percent of the peaks in the GC with the mass to be expected for the product. NMR spectroscopy and the tertiary carbo cations to be expected as intermediates during the alkylation make the following substitution patterns probable (stereoisomers are neglected).

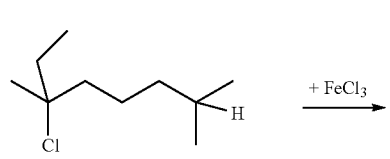 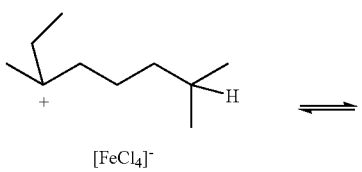 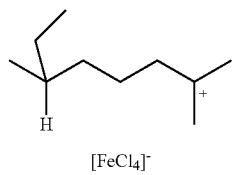

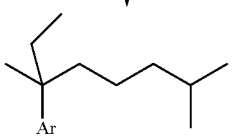 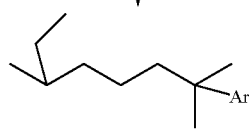

The C$_{10}$-alkyl substituents depicted are therefore intended to be representative below of the possible isomers and/or mixtures thereof in any desired percentage composition.

Fluorene can be alkylated analogously to give Alk3 and Alk4:

| Product name | Starting material | Product | Process Yield |
|---|---|---|---|
| Alk3 | 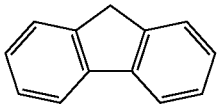 [SMILES: c1ccc2c(c1)Cc1ccccc1-2] | 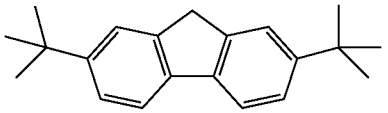 [SMILES: CC(C)(C)c1ccc2c(c1)Cc1cc(C(C)(C)C)ccc1-2] | A 82% |
| Alk4 | 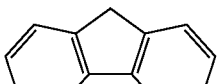 | 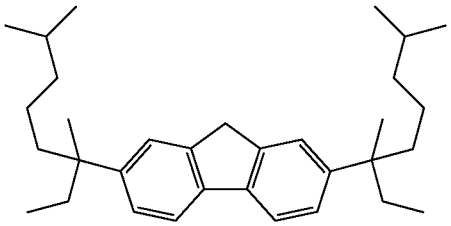 [SMILES: CCC(C)(CCCC(C)C)c1ccc2c(c1)Cc1cc(C(C)(CC)CCCC(C)C)ccc1-2] | B 79% |

A1.3 Preparation of the Bromides Bro1 to Bro7

A1.3.1 Bromination of Compounds Alk1 to Alk4

Preparation of 2-bromo-4,4'-di-t-butylbiphenyl (Bro1)

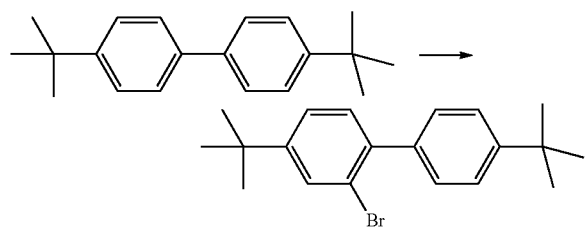

54.9 g (126 mmol) of 4,4'-di-1-butylbiphenyl are dissolved in 120 ml. 12.9 ml (253 mmol) of bromine in 40 ml of dichloromethane are added dropwise over the course of 15 minutes at room temperature with stirring, during which the mixture begins to boil. The mixture is heated under reflux for a further 3 hours. The mixture is then cooled to 0° C., and 50 ml of saturated aqueous sodium thiosulfate solution are added with vigorous stirring, and the mixture is stirred for a further 15 minutes. The phases are separated. The organic phase is washed twice with saturated aqueous sodium thiosulfate solution and twice with saturated aqueous sodium hydrogencarbonate solution, dried over sodium sulfate and freed from the solvent in a rotary evaporator. The residue is taken up in 50 ml of heptane and filtered through about 50 g of silica gel, which is then washed with 100 ml of heptane. The solvent is removed in a rotary evaporator. The residue which remains is purified in a short-path distillation at $10^{-3}$ mbar and a jacket temperature increased stepwise up to 180° C. 60.6 g (81% of theory) remain as yellowish solid.

Bromides Bro2 and Bro3 can be prepared analogously:

| Product name | Starting material | Product | Yield |
|---|---|---|---|
| Bro2 | | | 70% |
| Bro3 | | | 84% |

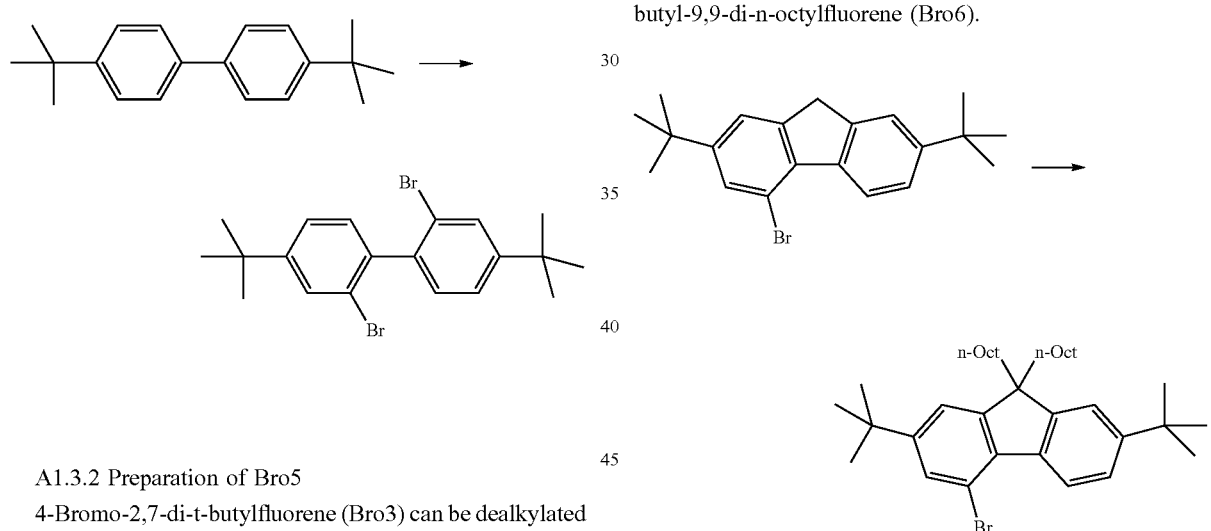

In an analogous manner, 2,2'-dibromo-4,4'-di-t-butylbiphenyl (Bro4) can also be prepared with a yield of 68% on use of two equivalents of bromine.

A1.3.2 Preparation of Bro5

4-Bromo-2,7-di-t-butylfluorene (Bro3) can be dealkylated in accordance with Bull. Chem. Soc. Jpn. 1986, 59, 97-103 to give 4-bromofluorene (Bro5):

A1.3.3 Preparation of Bro6

4-Bromo-2,7-di-t-butylfluorene (Bro3) can be alkylated analogously to Organometallics 2013, 32, 460-467 using 1-iodooctane (CAS 629-27-6) to give 4-bromo-2,7-di-t-butyl-9,9-di-n-octylfluorene (Bro6).

Bro7 can be prepared analogously

| Product name | Starting material | Product | Yield |
|---|---|---|---|
| Bro7 | | | 87% |

A1.4 Preparation of the Fluorenones Flu1 to Flu3

4-Bromo-2,7-di-t-butylfluorene can be oxidised in accordance with Bull. Chem. Soc. Jpn. 1988, 61, 995-996 using potassium permanganate to give 4-bromo-2,7-di-t-butyl-fluorenone (Flu1):

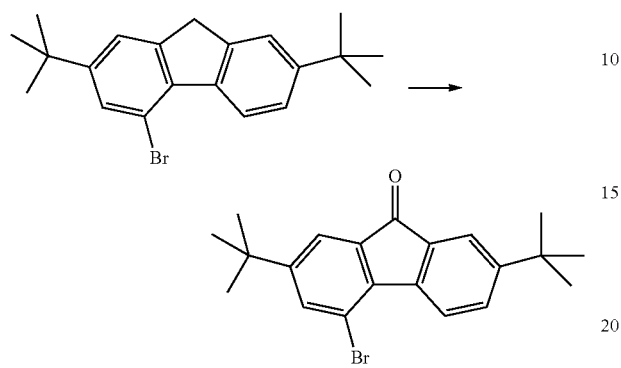

The compounds Flu2 and Flu3 can be prepared analogously:

| Product name | Starting material | Product | Yield |
|---|---|---|---|
| Flu2 | | | 84% |
| Flu3 | | | 71% |

A1.5 Preparation of the Spirobifluorenes Spi1 to Spi7

4-Bromo-9,9'-spirobifluorene (Spi1) can be prepared analogously to Organic Letters 2009, 11, 2607-2610 in accordance with the following scheme with a yield of 77% over the two steps.

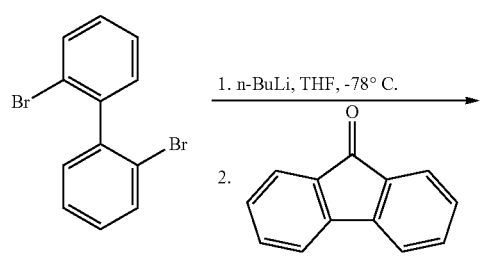

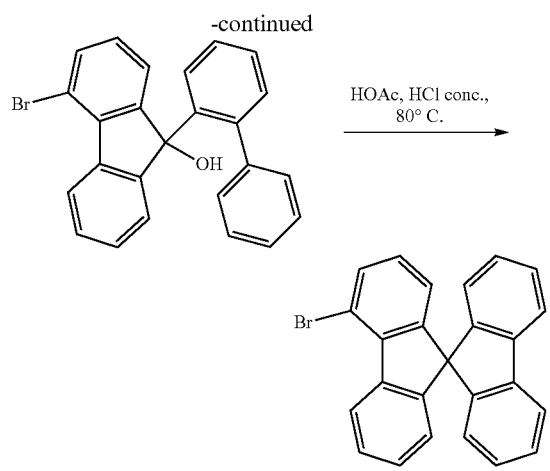

2,7-Dialkyl-substituted and 2,2',7,7'-tetraalkylated 4-bromo-9,9'-spirobifluorenes can be prepared analogously, as shown by way of example for the compounds Spi2 to Spi4:

| Product name | Bromide starting material | Fluorenone starting material | Product | Yield |
|---|---|---|---|---|
| Spi2 | | | | 82% |
| Spi3 | | | | 77% |
| Spi4 | | | | 60% |

-continued

| Product name | Bromide starting material | Fluorenone starting material | Product | Yield |
|---|---|---|---|---|
| Spi5 | (2,2'-dibromobiphenyl, CAS 13029-09-9) | 2,7-di-tert-butyl-9H-fluoren-9-one | 1-bromo-2',7'-di-tert-butyl-9,9'-spirobifluorene | 72% |

In an analogous process, 2',7'-dialkylated 4-bromo-9,9-spirobifluorenes can be prepared by reaction of 4,4'-dialkyl-substituted 2-bromobiphenyl and 4-bromofluorenone, as shown by way of example for the compounds Spi6 and Spi7:

| Product name | Bromide starting material | Fluorenone starting material | Product | Yield |
|---|---|---|---|---|
| Spi6 | 4,4'-di-tert-butyl-2-bromobiphenyl | 4-bromo-9H-fluoren-9-one, CAS 4269-17-4 | 4-bromo-2',7'-di-tert-butyl-9,9'-spirobifluorene | 85% |
| Spi7 | 4,4'-bis(2,4,4-trimethylpentan-2-yl)-2-bromobiphenyl | 4-bromo-9H-fluoren-9-one | 4-bromo-2',7'-bis(2,4,4-trimethylpentan-2-yl)-9,9'-spirobifluorene | 68% |

A1.6 Preparation of the triarylamines Mo6.A, Mo12.A to Mo16.A, Mo19.A to Mo22.A and Mo26.A

A1.6.1 Preparation of Mo6.A 2,8-Dibromo-6,6,12,12-tetraoctyl-6,12-dihydroindeno[1,2-b]fluorene can be prepared in accordance with Macromolecules 2000, 33, 2016-2020.

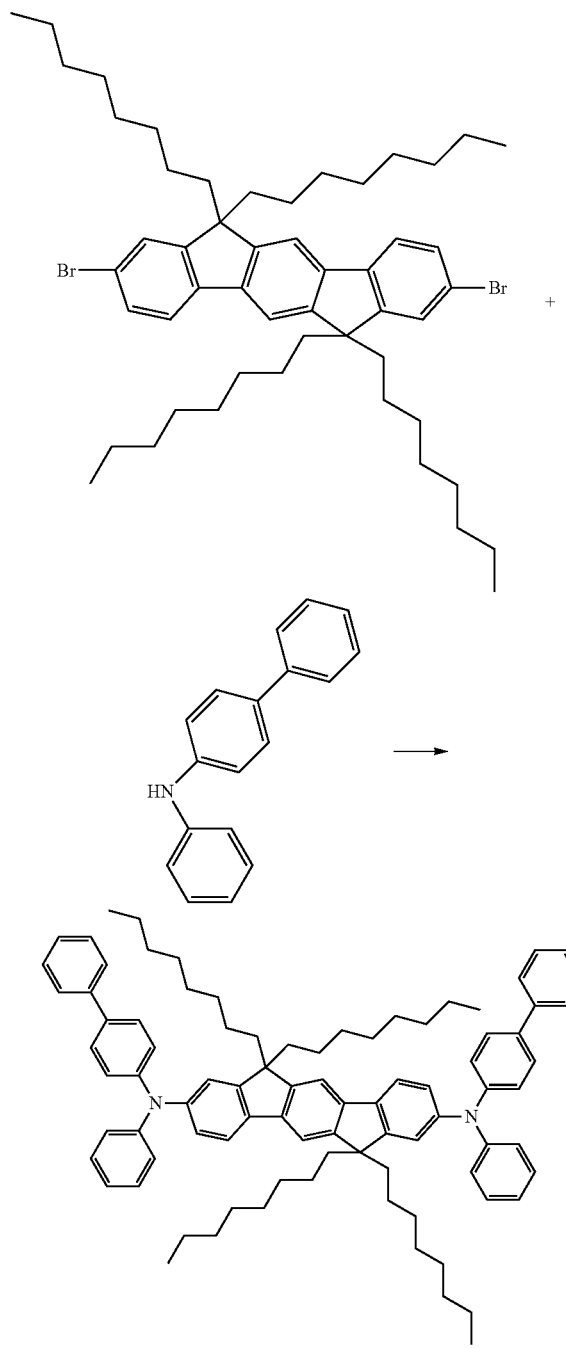

21.7 g (25 mmol) of 2,8-dibromo-6,6,12,12-tetraoctyl-6,12-dihydro-indeno[1,2-b]fluorene are dissolved in 0.2 l of dried toluene, 13.0 g (52 mmol) of biphenyl-4-ylphenylamines (CAS 32228-99-2), 26.3 g (80 mmol) of caesium carbonate and 0.23 g (1 mmol) of palladium(II) acetate are added successively as solid, and the solution is saturated with nitrogen. 2.0 ml (2 mmol) of tri-t-butylphosphine solution (1 M in toluene) are added, and the reaction mixture is stirred under reflux for 24 hours.

The solid is filtered off and washed with toluene. The filtrates are evaporated, stirred with hot ethanol, filtered off with suction and dried in a vacuum drying cabinet together with the precipitated solid, leaving 26.8 g (90% of theory) as yellow solid.

A1.6.2 Preparation of Mo12.A to Mo16.A, Mo19.A to Mo22.A

Process A

Preparation of biphenyl-2-yldiphenylamine (Mo13.A)

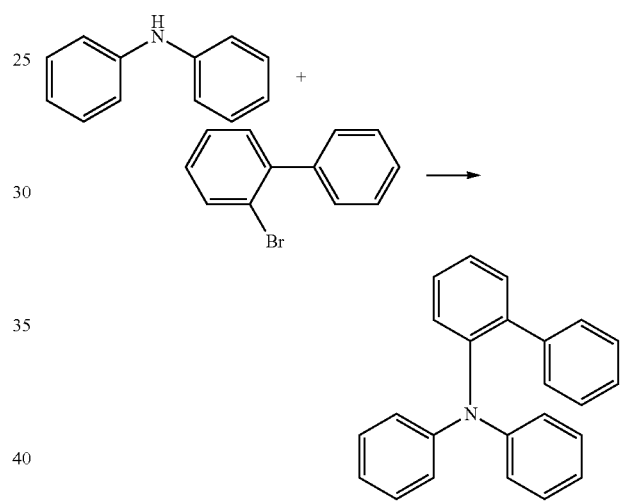

120.0 g (515 mmol) of 2-bromobiphenyl, 87.1 g (515 mmol) of diphenylamine and 74.2 g (772 mmol) of sodium t-butoxide are suspended in 2 l of toluene. The mixture is saturated with argon, 10 ml (10 mmol) of tri-t-butylphosphine (1M in toluene) and 1.1 g (5 mmol) of palladium(II) acetate are added, and the mixture is heated under reflux for 6 hours. After cooling to room temperature, solid constituents are filtered off, the organic phase is washed three times with 500 ml of water each time, dried over sodium sulfate and freed from the solvent in a rotary evaporator. The solid which remains is stirred twice for 30 minutes with 300 ml of heptane each time, filtered off and dried in a vacuum drying cabinet, leaving 126.0 g (76% of theory) as beige solid.

Process B

For compounds which are not obtained as solid in the final step or are not obtained in adequate purity after recrystallisation, a purification by column chromatography on silica gel (about 15 g per gram of substance) with heptane or toluene as eluent is carried out.

The compounds Mo12.A, Mo14.A to Mo16.A and Mo19.A to Mo22.A can be prepared analogously to the processes described:

| Product name | Starting material | Product | Process (eluent) Yield |
|---|---|---|---|
| Mo12.A | | | A 81% |
| Mo14.A | | | B (toluene) 58% |
| Mo15.A | CAS 89827-45-2 | | A 84% |
| Mo16.A | | | B (heptane) 64% |
| Mo19.A | | | A 73% |

| Product name | Starting material | Product | Process (eluent) Yield |
|---|---|---|---|
| Mo20.A | | | A 80% |
| Mo21.A | | | B (toluene) 68% |
| Mo22.A | | | B (heptane) 69% |

A1.6.3 Preparation of [9,9-bis-(4-formylphenyl)fluoren-4-yl]diphenylamine (Mo26. A)

Step 1

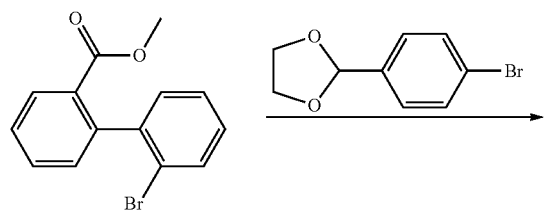

In a first flask, 66.1 g (0.29 mol) of 2-(4-bromophenyl)-1,3-dioxolane (CAS 10602-01-4) are dissolved in 200 ml of dried THF. The mixture is cooled to −78° C., and 115 ml of a 2.5 M solution of n-BuLi in hexane (0.29 mol) are slowly added dropwise. The mixture is stirred at −78° C. for one hour and then warmed to 20° C. over the course of 2 hours.

In a second flask, 40.0 g (137 mmol) of methyl 2'-bromobiphenyl-2-carboxylate (CAS 1000071-27-1) are dissolved in 150 ml of dried THF. This mixture is cooled to −78° C., and the mixture in the first flask is carefully added dropwise under a stream of argon. The reaction mixture is stirred at −78° C. for one hour, then slowly warmed to 20° C. and stirred at this temperature for 16 hours.

The reaction mixture is cooled to 0° C. and acidified using glacial acetic acid. The mixture is then boiled under reflux for 2 hours. 50 ml of a 0.1 M aqueous HCl solution are subsequently added. The reaction mixture is stirred under reflux for a further 20 hours. 200 ml of water are added, the phases are separated, and the organic phase is washed three times with 200 ml of water, dried, filtered through aluminium oxide (basic, activity grade 1) and evaporated. The residue is stirred with hot heptane, filtered off with suction and dried in a vacuum drying cabinet, leaving 27.4 g (44% of theory) as white solid.

Step 2:

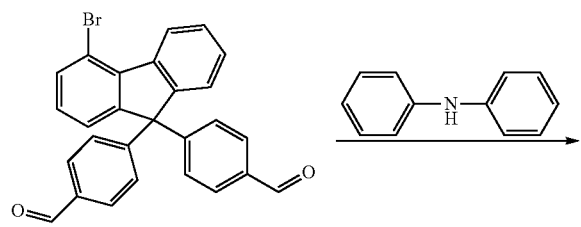

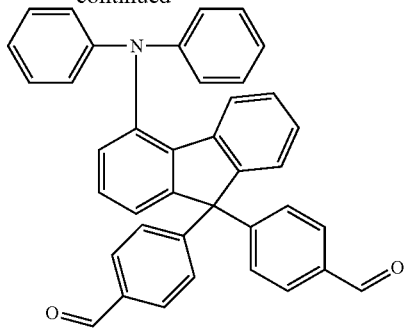

26.5 g (58.5 mmol) of 4-bromo-9,9-bis-(4-formylphenyl)fluorene are dissolved in 0.2 l of dried toluene, 9.9 g (58.5 mmol) of diphenylamine, 38.1 g (0.12 mol) of caesium carbonate and 0.26 g (1.1 mmol) of palladium(II) acetate are added successively, and the mixture is saturated with nitrogen. 2.3 ml (2.3 mmol) of tri-t-butylphosphine (1 M in toluene) are added, and the reaction mixture is stirred under reflux for 24 hours.

The solid is filtered off and washed with toluene. The filtrates are filtered together through aluminium oxide (basic, activity grade 1) and silica gel, evaporated, stirred with hot heptane, filtered off with suction and dried in a vacuum drying cabinet, leaving 20.6 g (65% of theory) as white solid.

A2. Preparation of the monomers

A2.1 Preparation of 3,3'-bis(pinacolatoboranyl)biphenyl (Mo10)

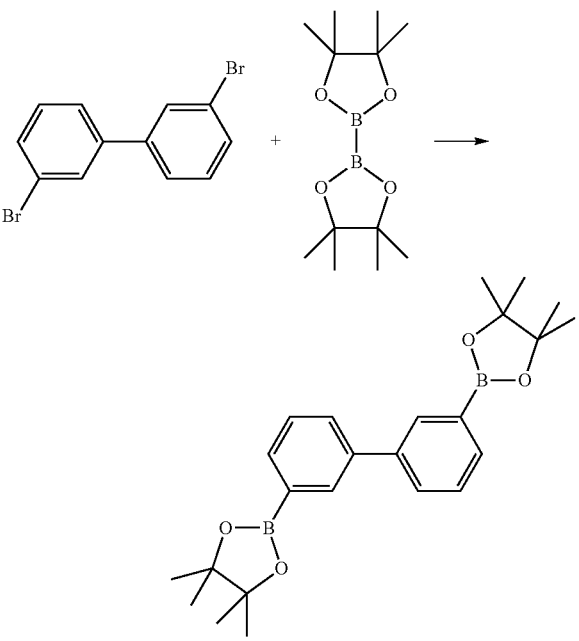

100.0 g (321 mmol) of 3,3'-dibromo-1,1'-biphenyl (CAS 16400-51-4), 244.2 g of bis(pinacolato)diborane (963 mmol), 125.8 g (1.3 mol) of potassium acetate) and 5.24 g (6 mmol) of 1,1-bis(diphenylphosphino)ferrocene-palladium(II) dichloride are heated under reflux for 2 days in 1 l of tetrahydrofuran with vigorous stirring. The reaction mixture is filtered through Celite at room temperature. The solvent is removed in vacuo, the solid which remains is recrystallised from acetonitrile. The solid formed is filtered off, dried in vacuo and subsequently sublimed at 140° C. and a pressure of $10^{-5}$ mbar, giving 55.7 g (43% of theory) of the product as colourless powder having a purity of 99.7% according to HPLC.

A2.2 Triarylamines Containing 4-Bromophenyl Radicals According to the Invention A2.2.1 Preparation of Mo6

26.0 g (21 mmol) of N,N'-bis(biphenyl-4-yl)-6,6,12,12-tetraoctyl-N,N'-diphenyl-6H,12H-indeno[1,2-b]fluorene-2,8-diamine are dissolved in 600 ml of dried THF and cooled to 0° C. 7.8 g (43 mmol) of N-bromosuccinimide are added in portions as solid, and the solution is stirred at room temperature for 14 hours.

The reaction mixture is evaporated. The residue is stirred in hot ethanol. The solid is filtered off, recrystallised three times from ethyl acetate (about 1000 ml) and subsequently dried in a vacuum drying cabinet, giving 23.0 g (78% of theory) of the product as yellow powder having a purity of 97.7% according to HPLC.

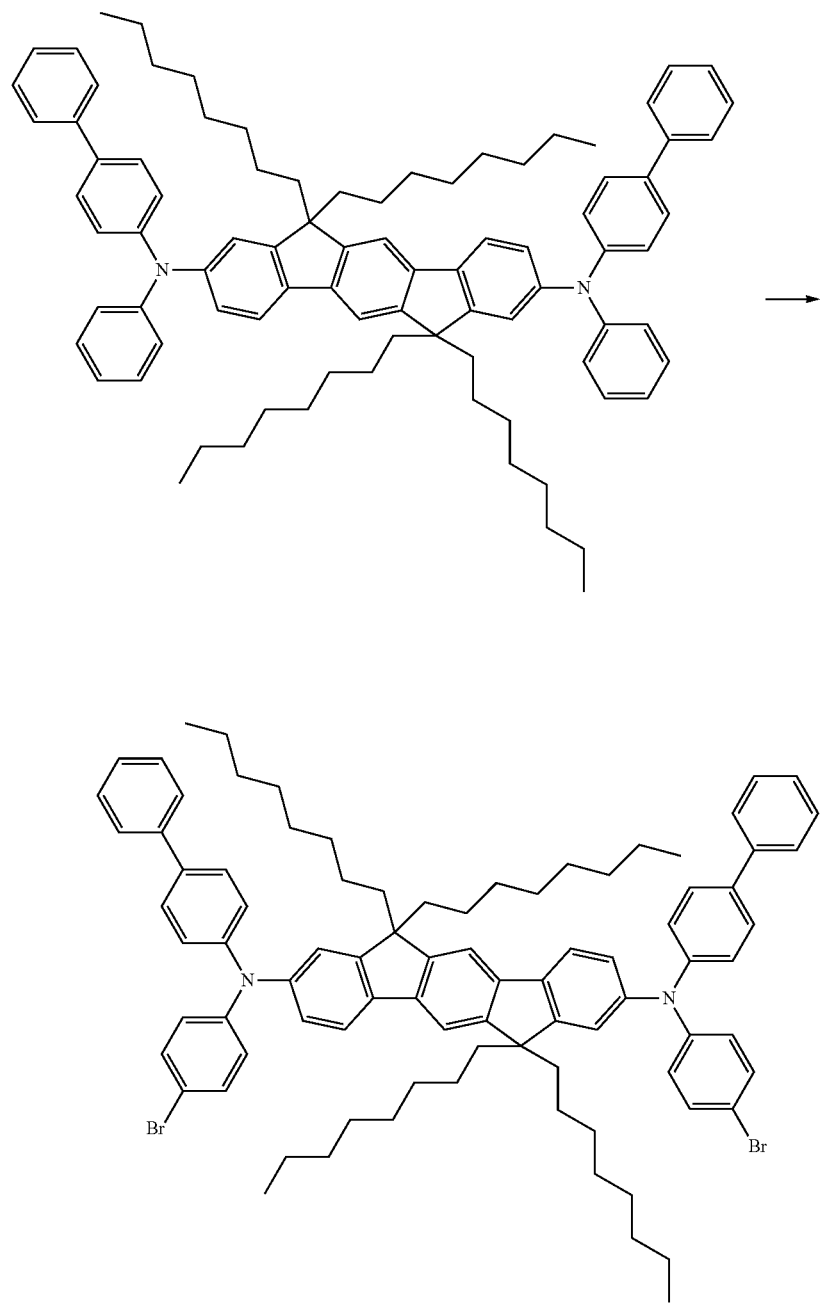

A2.2.2 Preparation of Mo12 to Mo15, Mo16.Br, Mo19.Br to Mo22.Br and Mo26.Br

Process A

Preparation of biphenyl-2-ylbis-(4-bromophenyl)amine (Mo13)

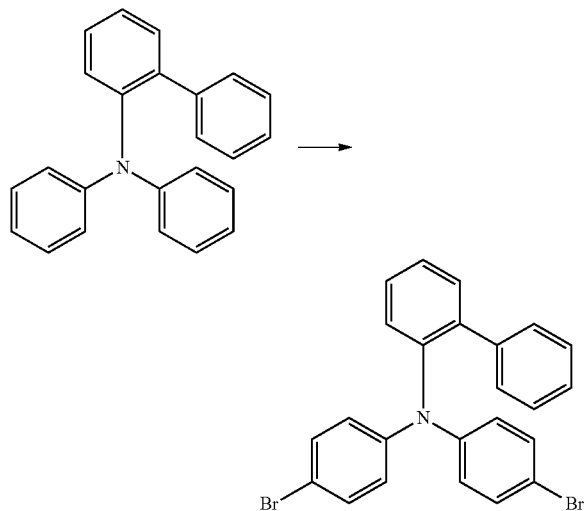

93.2 g (290 mmol) of biphenyl-2-yldiphenylamine (Mo13 A) are initially introduced in 1800 ml of THF and cooled to 0° C. 103.2 g (580 mmol) of N-bromosuccinimide as solid are then added in portions with vigorous stirring at such a rate that the temperature of the mixture does not exceed 5° C. The cooling is removed, and the mixture is stirred for a further 12 hours. The solvent is removed completely in a rotary evaporator. The residue is dissolved in about 500 ml of toluene, filtered through aluminium oxide (basic, activity grade 1) and again evaporated to dryness in a rotary evaporator. The solid which remains is recrystallised three times from about 850 ml of heptane. Any residues of succinimide still present can be removed by repeated washing of the solid by stirring with warm ethanol. After suction filtration and drying in a vacuum drying cabinet, it is subjected to fractional sublimation twice at $10^{-5}$ mbar and 260° C., leaving 101.7 g (71% of theory) as colourless glass-like solid having a purity of 99.8% according to HPLC.

Process B

For compounds which are not obtained as solid after filtration through aluminium oxide and removal of the solvent or are not obtained in adequate purity after recrystallisation, a purification by column chromatography on silica gel (about 10 g per gram of substance) with toluene as eluent is carried out. The solvent is then removed as far as possible in a rotary evaporator and finally heated at $10^{-5}$ mbar and 150° C. in order to remove residues of solvents and volatile impurities.

The following compounds can be prepared analogously to the processes described:

| Example | Starting material | Product | Process Yield (HPLC purity) |
|---|---|---|---|
| Mo12 | Mo12.A | | A 62% (99.9%) |
| Mo14 | Mo14.A | | A 44% (99.7%) |

-continued
| Example | Starting material | Product | Process Yield (HPLC purity) |
|---------|-------------------|---------|------------------------------|
| Mo15 | Mo15.A | 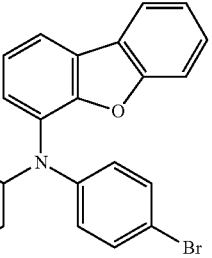 | A 31% (99.9%) |
| Mo16.Br | Mo16.A | 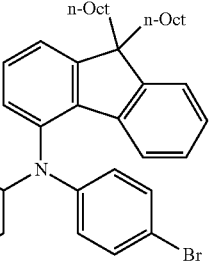 | A 57% (99.7) |
| Mo19.Br | Mo19.A | 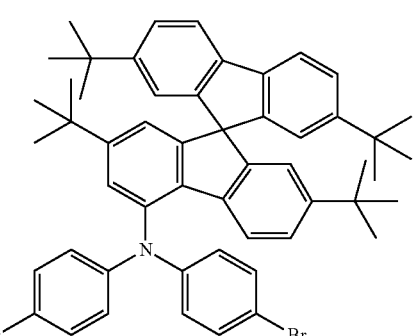 | A 61% (99.8%) |
| Mo20.Br | Mo20.A | 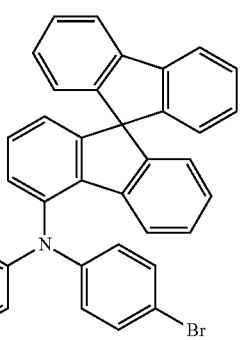 | A 61% (99.9%) |

A2.3 Triarylamines Containing 3-Bromophenyl Radicals According to the Invention Preparation of 2',7'-bis-(3,7-dimethyloctan-3-yl)-9,9'-spirobifluoren-4-ylbis(3-bromophenyl)amine (Mo24)

Step 1:

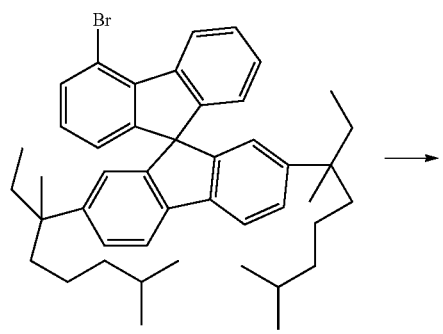

180.0 g (266 mmol) of 4-bromo-2',7'-bis-(3,7-dimethyloctan-3-yl)-9,9'-spirobifluorene (Spi7) are dissolved in 2 l of dried dioxane, 56.2 g (480 mmol) of t-butyl carbamate (CAS 4248-19-5), 182.5 g (560 mmol) of caesium carbonate and 12.3 g (21.3 mmol) of 4,5-bis(diphenylphosphino)-9,9-dimethylxanthene (xantphos) are added successively as solids, then the solution is saturated with nitrogen. 3.6 g (16 mmol) of palladium(II) acetate are added, and the reaction mixture is stirred under reflux for 2 days. The solvent is removed as far as possible in a rotary evaporator, and the dark residue is extracted with hot heptane. The solvent is removed completely in a rotary evaporator, and the solid which remains is recrystallised in a toluene/heptane mixture (1:1). The solid is filtered off with suction and dried in a vacuum drying cabinet, leaving 119.5 g (63% of theory) as pale-yellow solid.

Step 2:

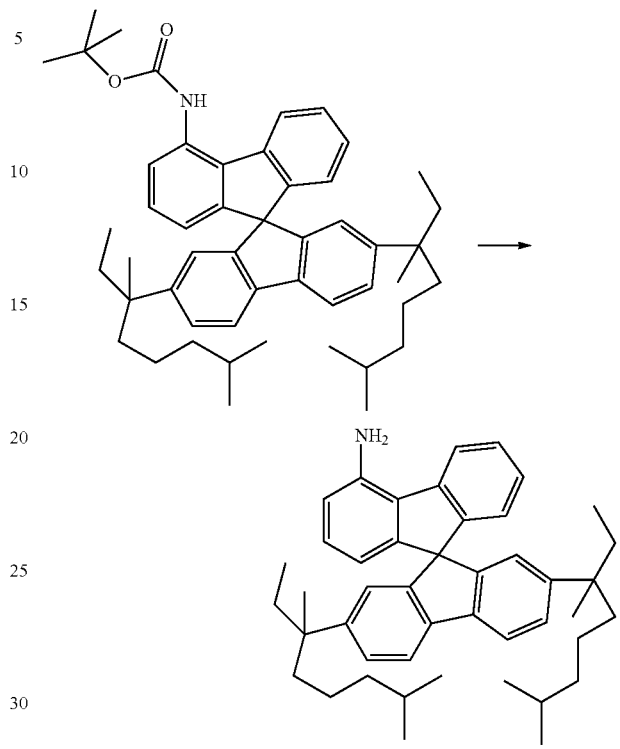

119.0 g (167.2 mmol) of t-butyl N-[2',7'-bis-(3,7-dimethyloctan-3-yl)-9,9'-spirobifluoren-4-yl]carbamate are dissolved in 500 ml of dried dichloromethane, 51.5 ml (670 mmol) of trifluoroacetic acid are carefully added dropwise. The reaction mixture is stirred at room temperature for 2 hours. The reaction mixture is evaporated, and the residue is dissolved in 300 ml of toluene. The organic phase is washed twice with 300 ml of NaOH (1M solution) each time and then with 400 ml of water. The organic phase is dried over sodium sulfate and freed from the solvent in a rotary evaporator, leaving 96.2 g (94% of theory) as white solid.

Step 3:

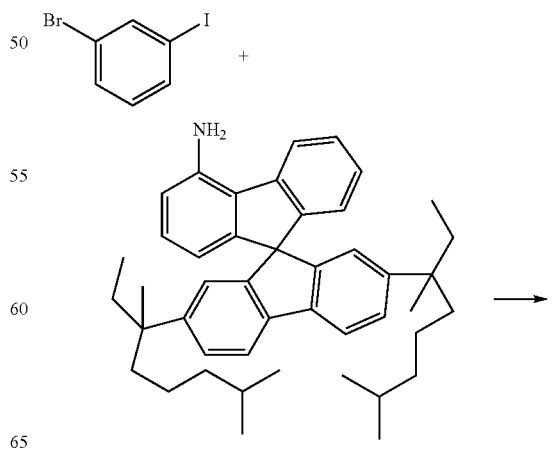

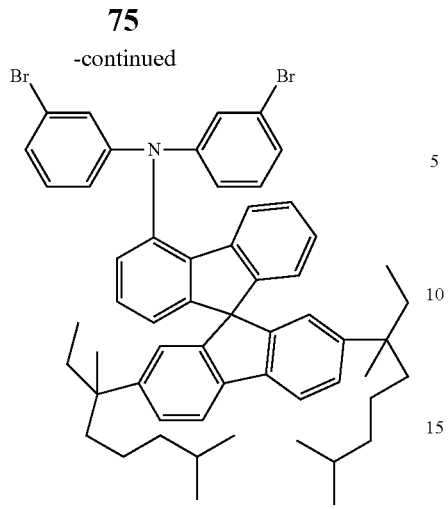

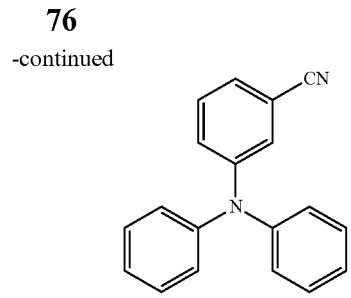

97.8 g (346 mmol) of 1-bromo-3-iodobenzene, 96.1 g (157 mmol) of 4-amino-2',7'-bis-(3,7-dimethyloctan-3-yl)-9,9'-spirobifluorene, 2.4 g (12.6 mmol) of copper(I) iodide, 70.4 g (1.26 mot) of potassium hydroxide and 2.27 g (12.6 mmol) of 1,10-phenanthroline are suspended in 750 ml of o-xylene. The reaction mixture is saturated with argon and stirred under reflux overnight. The mixture is cooled to room temperature and subsequently filtered through silica gel and aluminium oxide with toluene and evaporated in a rotary evaporator. The pale-brown solid is filtered off with suction. The solid is then purified by column chromatography (heptane). The product is recrystallised in a heptane/toluene mixture (1:1), giving 76.8 g (53% of theory) of the product as colourless powder having a purity of 99.7% according to HPLC.

Mo23 can be prepared analogously:

50.0 g (295 mmol) of diphenylamine are initially introduced in 1000 ml of toluene with 64.5 g (355 mmol) of 3-bromobenzonitrile, 20 ml (20 mmol) of tri-t-butylphosphine solution (1 M in toluene) 2.65 g (11 mmol) of palladium(II) acetate and 85.2 g (886 mmol) of sodium t-butoxide and heated under reflux with stirring for 15 hours. After cooling, the organic phase is washed three times with 1000 ml of water each time, dried over sodium sulfate and subsequently evaporated to dryness in vacuo. The solid which remains is extracted with about 400 ml of heptane in a continuous hot extractor through a bed of aluminium oxide (basic, activity grade 1). After cooling, the precipitated solid is filtered off, washed twice with about 200 ml of heptane and dried in vacuo, leaving 53.0 g (66% of theory) as pale-coloured solid.

| Example | Starting material | Product | Yield (HPLC purity) |
|---|---|---|---|
| Mo23 | 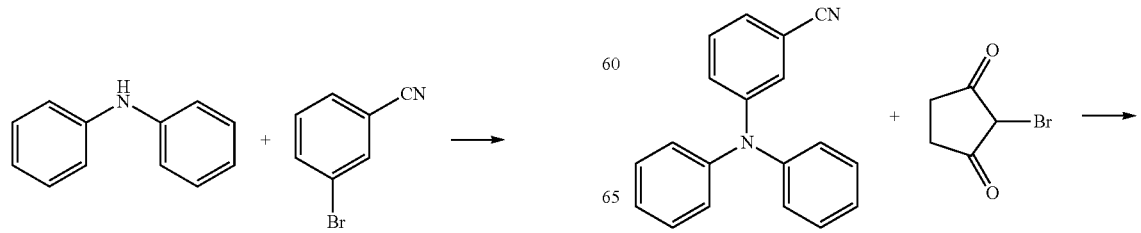 | | 64% (99.9%) |

A2.4 Triarylamines Containing Pinacolatoboronic Acid Ester Radicals According to the Invention

A2.4.1 Preparation of the Monomer Mo11

Step 1:

Step 2:

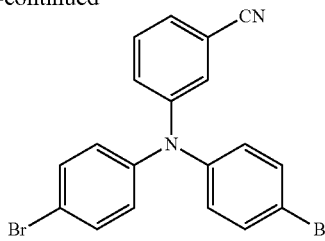

53.0 g (196 mmol) of 3-diphenylaminobenzonitrile are dissolved in 500 ml of dry tetrahydrofuran and cooled to 0° C. 69.8 g (392 mmol) of N-bromosuccinimide as solid are added in portions with ice-cooling and vigorous stirring at such a rate that the temperature does not exceed 5° C. The cooling is removed, and the mixture is stirred for 12 hours. The solvent is removed in vacuo, and the solid which remains is dissolved in as little ethyl acetate as possible. The solution is washed three times with about 500 ml of aqueous sodium hydroxide solution (5%) and twice with water. The organic phase is evaporated to dryness, leaving 70.8 g (84% of theory) as colourless solid.

Step 3:

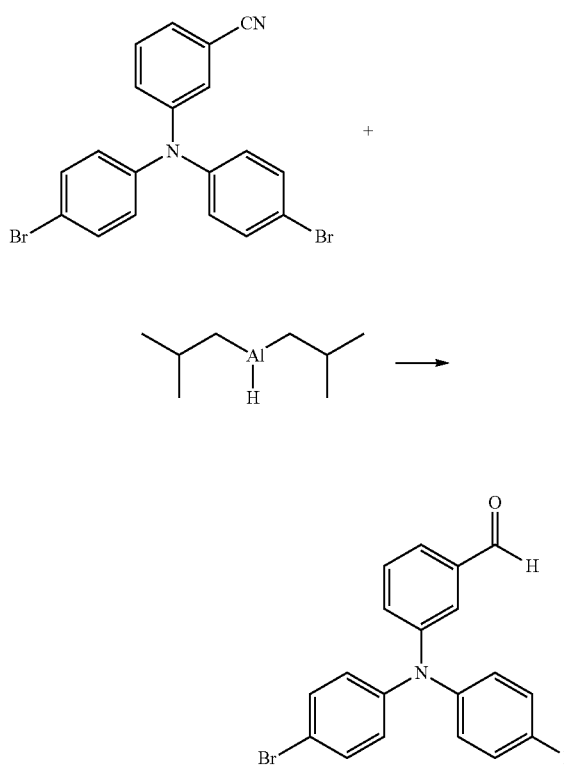

70.8 g (165 mmol) of 3-[bis-(4-bromophenyl)]benzonitrile are dissolved in 700 ml of dry dichloromethane and cooled to −78° C. 174 ml (174 mmol) of a 1 M solution of diisobutylaluminium hydride in toluene are added dropwise at such a rate that the temperature does not exceed −50° C. The cooling is removed, the mixture is allowed to warm to 10° C. and is again cooled to −10° C. After addition of 175 ml of tetrahydrofuran, a mixture of 43 g of concentrated sulfuric acid and 175 ml of water is rapidly added, and the mixture is stirred without further cooling for 12 hours. The mixture is rendered neutral using aqueous sodium hydroxide solution. The organic phase is separated off, washed twice with about 350 ml of water and once with 350 ml of saturated sodium chloride solution and dried over magnesium sulfate. The solvent is removed in a rotary evaporator, leaving a yellow oil, which crystallises within 24 hours. The solid is extracted with about 300 ml of heptane in a continuous hot extractor through a bed of aluminium oxide (basic, activity grade 1) and, after cooling, filtered off and recrystallised three times from isopropanol. Drying in vacuo leaves 13.0 g (18% of theory) as yellow solid.

Step 4:

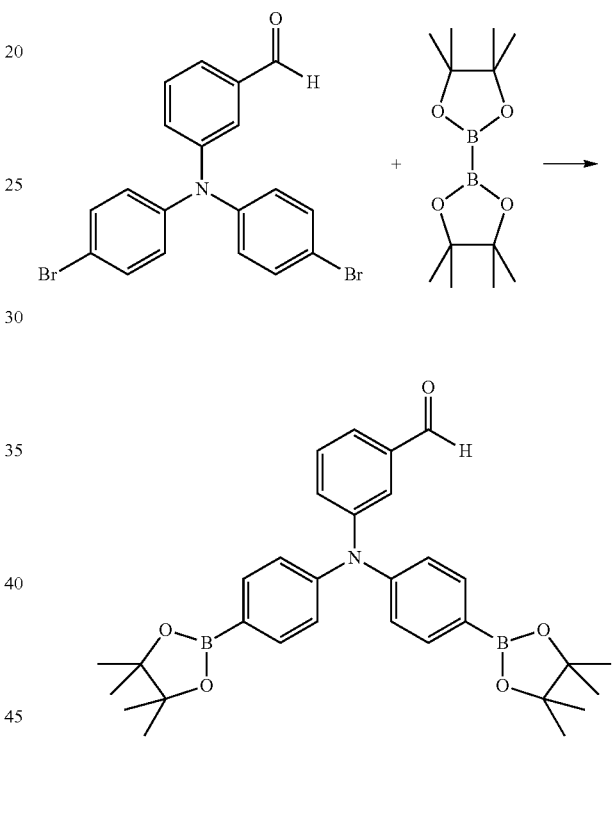

13.0 g (30 mmol) of 3-[bis-(4-bromophenyl)amino]benzaldehyde, 33.7 g (137 mmol) of bis(pinacolato)diborane, 14.8 g (151 mmol) of potassium acetate, 0.27 g (1.2 mmol) of palladium(II) acetate and 0.69 g (1.2 mmol) of bis(diphenylphosphino)ferrocene are heated under reflux in 500 ml of dioxane with vigorous stirring for 14 hours. The solvent is removed in vacuo, the solid which remains is taken up in as little ethyl acetate as possible and filtered through silica gel with a mixture of ethyl acetate and heptane (1:1). The solvent is removed in vacuo, and the oil which remains is stirred with about 100 ml of heptane for 2 hours. The solid formed during this time is filtered off, dried in vacuo and subsequently subjected to fractional sublimation at 200° C. and a pressure of $10^{-5}$ mbar, giving 3.5 g (22% of theory) of the product as colourless powder having a purity of 99.8% according to HPLC.

A2.4.2 Preparation of the Monomers Mo16 to Mo22 and Mo25 and Mo26

Process A

Preparation of
biphenyl-2-ylbis(4-pinacolatoboranylphenyl)amine
(Mo18)

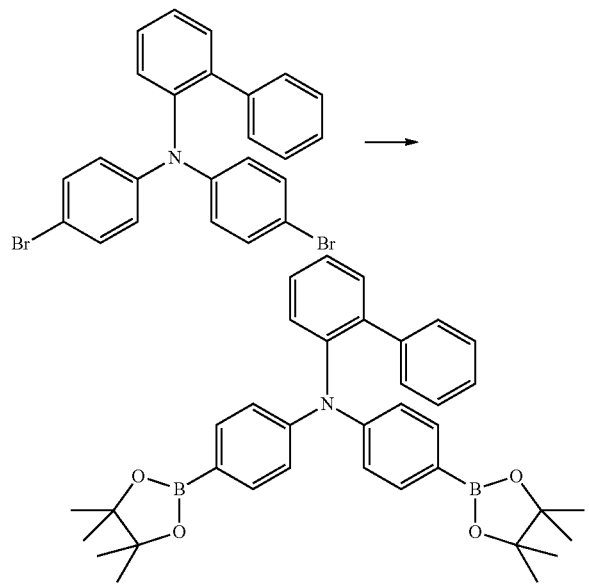

124.6 g (260 mmol) of biphenyl-2-ylbis(4-bromophenyl) amine (Mo13). 140 g (551 mmol) of bis(pinacolato)diborane and 128.8 g (1313 mmol) of potassium acetate are initially introduced in 2.4 l of dioxane. The mixture is saturated with argon, 6.00 g (11 mmol) of 1,1'-bis(diphenylphosphino) ferrocene and 2.47 g (11 mmol) of palladium(II) acetate are added, and the mixture is heated under reflux for 14 hours. After cooling to room temperature, the mixture is filtered through about 150 g of Celite, and the solvent is removed as far as possible in a rotary evaporator. The dark-brown oil which remains is taken up with about 1000 ml of heptane and stirred vigorously for 3 hours, during which a brown solid precipitates out. After suction filtration, the solid is extracted with about 1000 ml of heptane for about 16 hours from two extraction thimbles inserted into one another in a continuous hot extractor without adsorbent. After cooling to room temperature, the solid is filtered off with suction, and the mother liquor is evaporated to dryness in a rotary evaporator. The two solids are combined and again hot-extracted as described; the extraction thimbles used are still only weakly coloured after the second extraction. The mother liquor is again evaporated to dryness and combined with the precipitated-out solids. The mixture is taken up in about 250 ml of heptane, the suspension is heated to reflux, and toluene is added dropwise until complete dissolution (about 140 ml). After cooling to room temperature, the solid formed is filtered off with suction and recrystallised again as described. After the solid has been filtered off with suction and dried in a vacuum drying cabinet, it is subjected to fractional sublimation twice at $10^{-5}$ mbar and 250° C., leaving 47.7 g (32% of theory) as colourless glass-like solid having a purity of 99.9% according to HPLC.

Process B

Compounds which exhibit decomposition on sublimation are heated at $10^{-5}$ mbar and 180° C. after recrystallisation in order to remove residues of solvents and volatile impurities.

Process C

For compounds which are not obtained as solid even after extended stirring with heptane (up to 24 hours) or are not obtained in adequate purity after recrystallisation, a purification by column chromatography on silica gel (about 20 g per gram of substance) with toluene as eluent is carried out.

The solvent is then removed as far as possible in a rotary evaporator and finally heated at $10^{-5}$ mbar and 180° C. in order to remove residues of solvents and volatile impurities.

The following compounds can be prepared analogously to the processes described:

| Example | Starting material | Product | Process Yield (HPLC purity) |
|---|---|---|---|
| Mo16 | Mo16.Br | | C 47% (99.8%) |

-continued

| Example | Starting material | Product | Process Yield (HPLC purity) |
|---|---|---|---|
| Mo17 | Mo12 | (structure) | A 43% (99.8%) |
| Mo19 | Mo19.Br | (structure) | A 38% (99.7%) |
| Mo20 | Mo20.Br | (structure) | A 45% (99.9%) |

-continued
| Example | Starting material | Product | Process Yield (HPLC purity) |
|---|---|---|---|
| Mo21 | Mo21.Br | 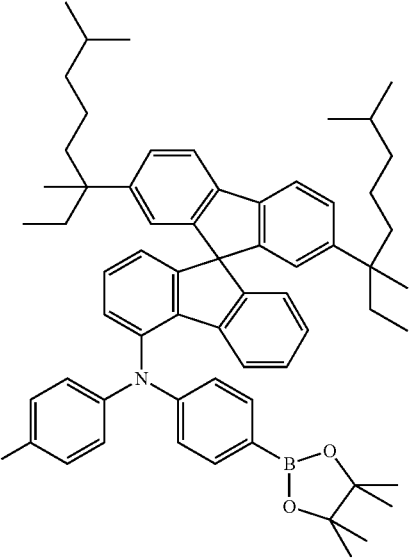 | B 52% (99.6%) |
| Mo22 | Mo22.Br | 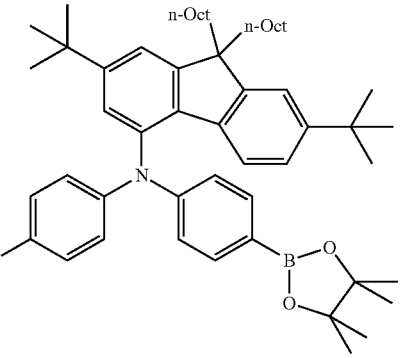 | C 31% (99.8%) |
| Mo25 | Mo24 | 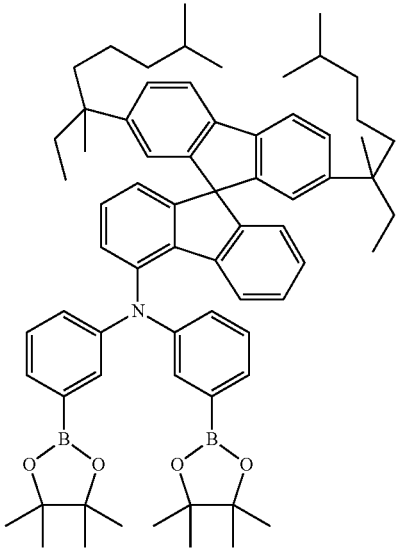 [SMILES: CCC(C)(CCCC(C)C)c1ccc2c(c1)C1(c3cc(C(C)(CC)CCCC(C)C)ccc3-2)c2ccccc2-c2c(N(c3cccc(B4OC(C)(C)C(C)(C)O4)c3)c3cccc(B4OC(C)(C)C(C)(C)O4)c3)cccc21] | B 48% (99.7%) |

-continued

| Example | Starting material | Product | Process Yield (HPLC purity) |
|---|---|---|---|
| Mo26 | Mo26.Br | 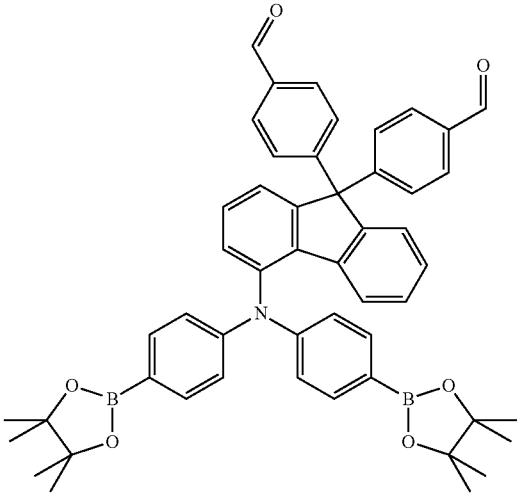 | B 56% (99.7%) |

A2.5 Further Monomers

Further monomers for the preparation of the polymers according to the invention have already been described in the prior art, are commercially available or are prepared in accordance with literature procedure and are summarised in the following table:

| Monomer | Structure | Synthesis in accordance with |
|---|---|---|
| Mo1 | 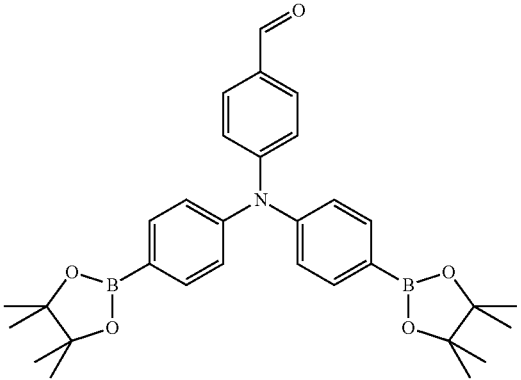 | WO 2010/097155 A1 |
| Mo2 | 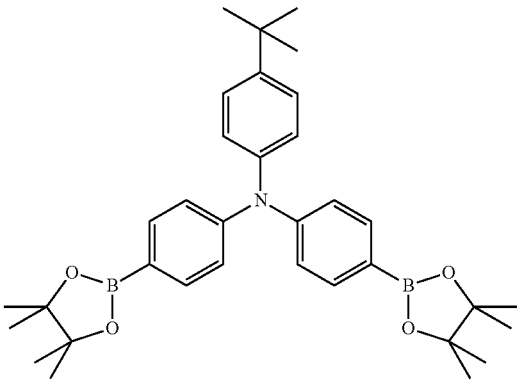 | WO 99/048160 A1 |

| Monomer | Structure | Synthesis in accordance with |
|---|---|---|
| Mo3 | 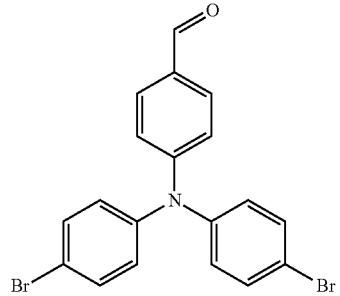 [SMILES: O=Cc1ccc(N(c2ccc(Br)cc2)c2ccc(Br)cc2)cc1] | WO 2010/097155 A1 |
| Mo4 | 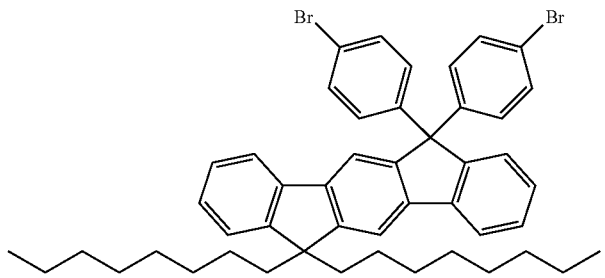 [SMILES: CCCCCCCCC1(CCCCCCCC)c2ccccc2-c2cc3c(cc21)-c1ccccc1C3(c1ccc(Br)cc1)c1ccc(Br)cc1] | WO 2010/136111 |
| Mo5 | 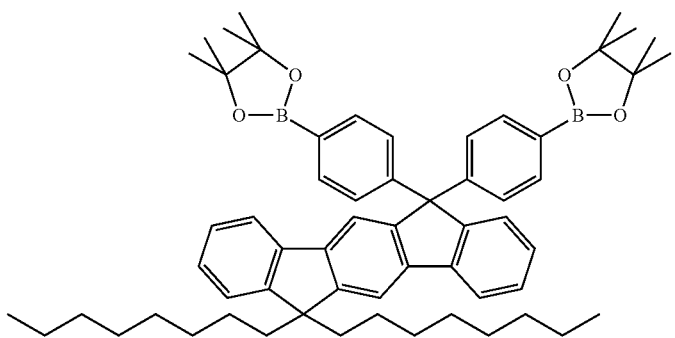 [SMILES: CCCCCCCCC1(CCCCCCCC)c2ccccc2-c2cc3c(cc21)-c1ccccc1C3(c1ccc(B2OC(C)(C)C(C)(C)O2)cc1)c1ccc(B2OC(C)(C)C(C)(C)O2)cc1] | WO 2010/136111 |
| Mo7 | 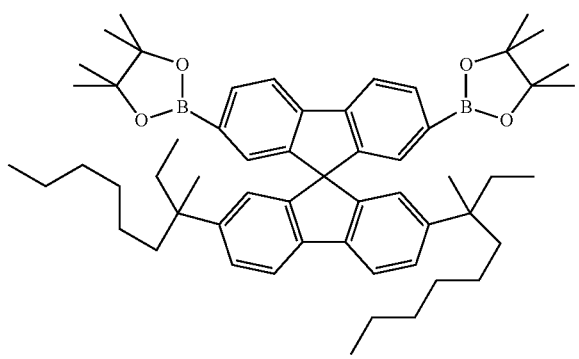 [SMILES: CCCCCCC(C)(CC)c1ccc2c(c1)C1(c3cc(B4OC(C)(C)C(C)(C)O4)ccc3-c3ccc(B4OC(C)(C)C(C)(C)O4)cc31)c1cc(C(C)(CC)CCCCCC)ccc1-2] | WO 03/020790 |

-continued

| Monomer | Structure | Synthesis in accordance with |
|---|---|---|
| Mo8 | (structure with dibromo-indenofluorene bearing hexyl and octyl chains) | Macromolecules 2000, 33, 2016-2020 |
| Mo9 | 3,3'-dibromobiphenyl | CAS 16400-51-4 |

Part B: Synthesis of the Polymers

Preparation of comparative polymers V1 and V2 and polymers Po1 to Po22 according to the invention.

Comparative polymers V1 and V2 and polymers Po1 to Po22 according to the invention are prepared from the monomers disclosed in part A by SUZUKI coupling in accordance with the process described in WO 2010/097155.

Polymers V1 and V2 and Po1 to Po22 prepared in this way contain the structural units in the percentage proportions indicated in Table 2 (percent data=mol %) after removal of the leaving groups. In the case of the polymers prepared from monomers containing aldehyde groups, these are converted into crosslinkable vinyl groups after the polymerisation by WITTIG reaction in accordance with the process described in WO 2010/097155. The polymers correspondingly shown in Table 2 and employed in part C thus contain crosslinkable vinyl groups instead of the aldehyde groups originally present.

The palladium and bromine contents of the polymers are determined by ICP-MS. The values determined are below 10 ppm.

The molecular weights $M_w$ and the polydispersities D are determined by means of gel permeation chromatography (GPC) (model: Agilent HPLC System Series 1100) (column: PL-RapidH from Polymer Laboratories; solvent: THF with 0.12% by vol, of o-dichlorobenzene; detection: UV and refractive index, temperature: 40° C.). The calibration is carried out using polystyrene standards.

The results are summarised in Table 2.

TABLE 2

| Polymer | Triarylamine with ortho substituent | | | | Further monomers | | | | | | Molecular weight $M_w$ (g/mol) | Polydisp. D |
|---|---|---|---|---|---|---|---|---|---|---|---|---|
| V1 | | | | | Mo2 | 50% | Mo8 | 50% | | | 438 000 | 3.3 |
| V2 | | | | | Mo2 | 40% | Mo1 | 10% | Mo8 | 50% | 417 000 | 3.1 |
| Po1 | Mo18 | 50% | | | Mo8 | 50% | | | | | 339 000 | 3.1 |
| Po2 | Mo18 | 40% | | | Mo8 | 50% | Mo1 | 10% | | | 328 000 | 2.9 |
| Po3 | Mo18 | 50% | | | Mo8 | 30% | Mo1 | 20% | | | 176 000 | 3.8 |
| Po4 | Mo18 | 40% | | | Mo6 | 50% | Mo1 | 10% | | | 123 000 | 3.3 |
| Po5 | Mo18 | 40% | | | Mo8 | 50% | Mo11 | 10% | | | 300 000 | 2.7 |
| Po6 | Mo18 | 49% | | | Mo8 | 50% | Mo2 | 1% | | | 266 000 | 2.8 |
| Po7 | Mo18 | 50% | | | Mo4 | 50% | | | | | 102 000 | 4.8 |
| Po8 | Mo13 | 40% | | | Mo5 | 50% | Mo3 | 10% | | | 20 000 | 2.0 |
| Po9 | Mo16 | 40% | | | Mo9 | 50% | Mo1 | 10% | | | 85 000 | 3.8 |
| Po10 | Mo16 | 40% | Mo26 | 10% | Mo9 | 50% | | | | | 123 000 | 3.3 |
| Po11 | Mo12 | 40% | | | Mo10 | 50% | Mo3 | 10% | | | 143 000 | 2.9 |
| Po12 | Mo21 | 42% | | | Mo4 | 50% | Mo1 | 8% | | | 154 000 | 3.1 |
| Po13 | Mo24 | 50% | Mo25 | 40% | Mo1 | 10% | | | | | 155 000 | 2.6 |
| Po14 | Mo23 | 40% | | | Mo7 | 50% | Mo3 | 10% | | | 120 000 | 3.7 |

TABLE 2-continued

| Polymer | Triarylamine with ortho substituent | | | | | Further monomers | | | | Molecular weight $M_w$ (g/mol) | Polydisp. D |
|---|---|---|---|---|---|---|---|---|---|---|---|
| Po15 | Mo14 | 40% | | | | Mo10 | 50% | Mo3 | 10% | 288 000 | 2.9 |
| Po16 | Mo20 | 50% | | | | Mo8 | 50% | | | 403 000 | 2.2 |
| Po17 | Mo17 | 50% | | | | Mo8 | 50% | | | 387 000 | 2.5 |
| Po18 | Mo21 | 50% | | | | Mo9 | 50% | | | 120 000 | 3.4 |
| Po19 | Mo19 | 40% | | | | Mo4 | 50% | Mo1 | 10% | 198 000 | 3.3 |
| Po20 | Mo24 | 50% | Mo21 | 35% | Mo26 15% | | | | | 131 000 | 3.1 |
| Po21 | Mo15 | 50% | Mo16 | 30% | | Mo1 | 20% | | | 151 000 | 3.0 |
| Po22 | Mo22 | 50% | Mo23 | 50% | | | | | | 190 000 | 3.9 |

Part C: Production of the OLEDs

The polymers according to the invention can be processed from solution and result in OLEDs which are significantly easier to produce than vacuum-processed OLEDs, but nevertheless have good properties.

Whether the crosslinkable variants of the polymers according to the invention give a completely insoluble layer after crosslinking is tested analogously to WO 2010/097155.

Table C1 shows the remaining layer thickness of the originally 20 nm after the washing operation described in WO 2010/097155. If the layer thickness does not reduce, the polymer is insoluble and the crosslinking is thus adequate.

TABLE 3

Check of the residual layer thickness from originally 20 nm after washing test

| Polymer | Residual layer thickness after washing test [in nm] Crosslinking at 220° C. |
|---|---|
| V1 | 3.5 |
| V2 | 20 |
| Po02 | 20 |
| Po04 | 20 |
| Po05 | 20 |
| Po10 | 20 |

As can be seen in Table 3, comparative polymer V1, which carries no crosslinking group, hardly crosslinks at all at 220° C. Comparative polymer V2 and polymers Po02, Po04, Po05 and Po10 according to the invention crosslink completely at 220° C.

The production of solution-based OLEDs of this type has already been described many times in the literature, for example in WO 2004/037887 and WO 2010/097155. The process is adapted to the circumstances described below (layer-thickness variation, materials).

The polymers according to the invention are used in two different layer sequences.

Structure A is as follows:
substrate,
ITO (50 nm),
PEDOT (80 nm),
hole-transport layer (HTL) (20 nm),
emission layer (EML) (60 nm),
hole-blocking layer (HBL) (10 nm),
electron-transport layer (ETL) (40 nm),
cathode.

Structure B is as follows:
substrate,
ITO (50 nm),
PEDOT (20 nm),
hole-transport layer (HTL) (40 nm),
emission layer (EML) (30 nm),
electron-transport layer (ETL) (20 nm),
cathode.

Glass plates coated with structured ITO (indium tin oxide) in a thickness of 50 nm serve as substrate. These are coated with PEDOT:PSS for better processing. The spin coating is carried out from water in air. The layer is dried by heating at 180° C. for 10 minutes. PEDOT:PSS is purchased from Heraeus Precious Metals GmbH & Co. KG, Germany. The hole-transport and emission layers are applied to these coated glass plates.

The compounds according to the invention and comparative compounds, in each case dissolved in toluene, are used as hole-transport layer. The typical solids content of such solutions is about 5 g/l if, as here, the layer thicknesses of 20 or 40 nm which are typical for a device is to be achieved by means of spin coating. The layers are applied by spin coating in an inert-gas atmosphere, in the present case argon, and dried by heating at 180° C. or 220° C. for 60 minutes.

The emission layer is always composed of at least one matrix material (host material) and an emitting dopant (emitter). Furthermore, mixtures of a plurality of matrix materials and co-dopants may occur. An expression such as H1 (92%):dopant (8%) here means that material H1 is present in the emission layer in a proportion by weight of 92% and the dopant is present in the emission layer in a proportion by weight of 8%. The mixture for the emission layer is dissolved in toluene for structure A. The typical solids content of such solutions is about 18 g/l if, as here, the layer thickness of 60 nm which is typical for a device is to be achieved by means of spin coating. The layers are applied by spin coating in an inert-gas atmosphere, in the present case argon, and dried by heating at 180° C. for 10 minutes. In structure B, the emission layer is formed by thermal evaporation in a vacuum chamber. The layer here may consist of more than one material, which are mixed with one another in a certain proportion by volume by co-evaporation. An expression such as H3:dopant (95%:5%) here means that materials H3 and dopant are present in the layer in a proportion by volume of 95%:5%.

The materials used in the present case are shown in Table C2.

TABLE 4
Structural formulae of the materials used in the emission layer
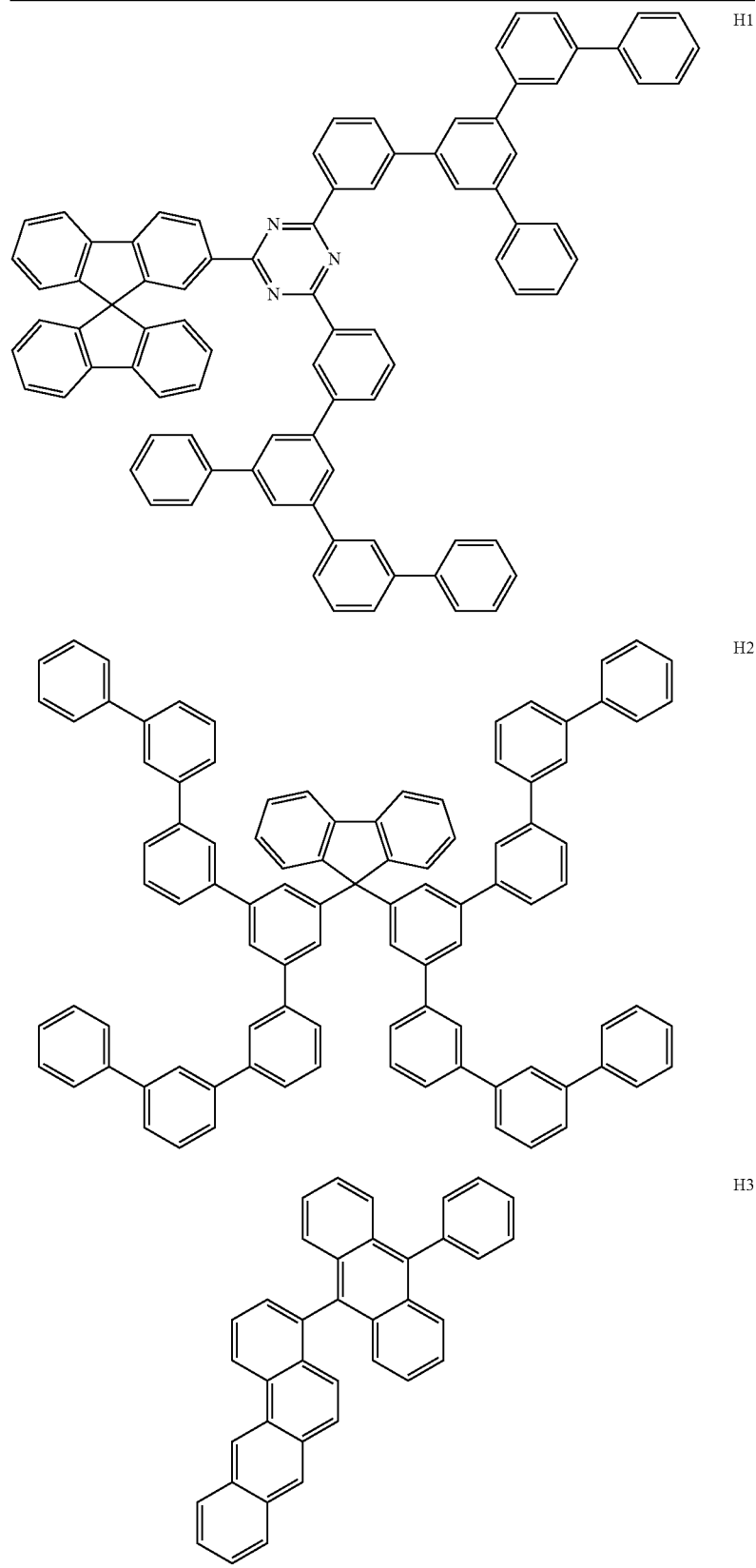

TABLE 4-continued

Structural formulae of the materials used in the emission layer

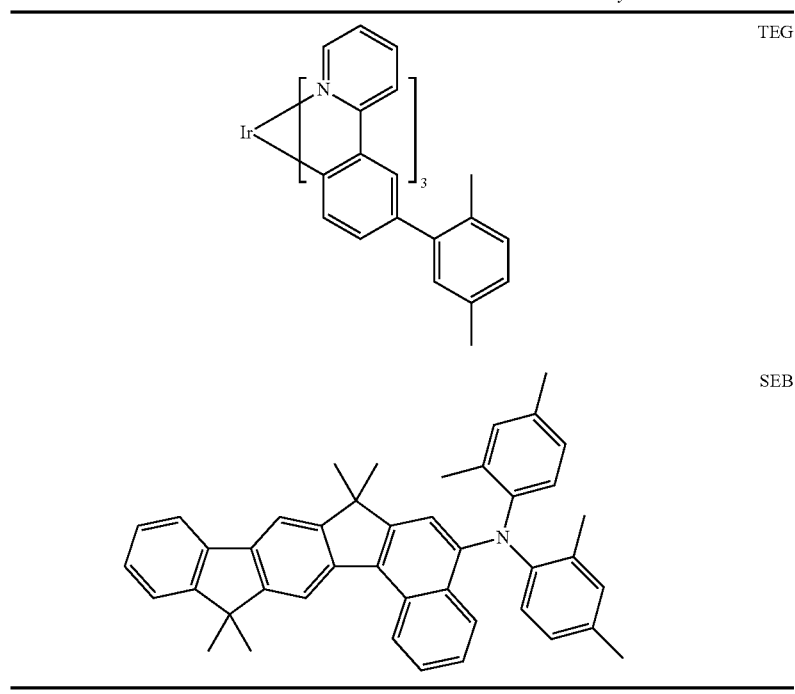

TEG

SEB

The materials for the hole-blocking layer and electron-transport layer are likewise applied by thermal vapour deposition in a vacuum chamber and are shown in Table 5. The hole-blocking layer consists of ETM1. The electron-transport layer consists of the two materials ETM1 and ETM2, which are mixed with one another in a proportion by volume of 50% each by co-evaporation.

TABLE 5

HBL and ETL materials used

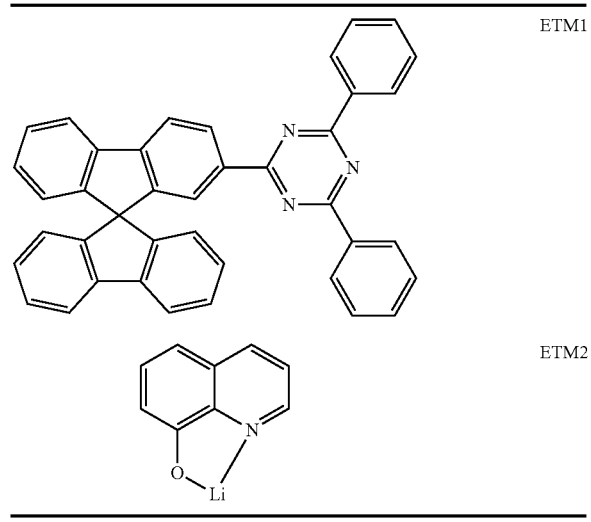

ETM1

ETM2

The cathode is formed by the thermal evaporation of an aluminium layer with a thickness of 100 nm.

The precise structure of the OLEDs is shown in Table 6. Column HTL shows the polymer used and the temperature at which the layer is dried by heating and optionally cross-linked.

TABLE 6

Structure of the OLEDs

| Example | HTL Polymer | T [° C.] | EML Structure | Composition |
|---|---|---|---|---|
| C01 | V1 | 180° C. | B | H3 95%; SEB 5% |
| C02 | V2 | 180° C. | A | H1 30%; H2 55%; TEG 15% |
| C03 | Po01 | 180° C. | B | H3 95%; SEB 5% |
| C04 | Po02 | 180° C. | A | H1 30%; H2 55%; TEG 15% |
| C05 | Po03 | 180° C. | A | H1 30%; H2 55%; TEG 15% |
| C06 | Po04 | 220° C. | A | H1 30%; H2 55%; TEG 15% |
| C07 | Po05 | 220° C. | A | H1 30%; H2 55%; TEG 15% |
| C08 | Po06 | 180° C. | B | H3 95%; SEB 5% |
| C09 | Po07 | 180° C. | B | H3 95%; SEB 5% |
| C10 | Po08 | 220° C. | A | H1 30%; H2 55%; TEG 15% |
| C11 | Po09 | 220° C. | A | H1 30%; H2 55%; TEG 15% |
| C12 | Po10 | 180° C. | A | H1 30%; H2 55%; TEG 15% |
| C13 | Po14 | 180° C. | A | H1 30%; H2 55%; TEG 15% |
| C14 | Po18 | 180° C. | B | H3 95%; SEB 5% |
| C15 | Po19 | 180° C. | A | H1 30%; H2 55%; TEG 15% |

The OLEDs are characterised by standard methods. For this purpose, the electroluminescence spectra, current/voltage/luminous density characteristic lines (IUL characteristic lines) assuming Lambert emission characteristics and the (operating) lifetime are determined. The IUL characteristic lines are used to determine characteristic numbers such as the operating voltage (in V) and the external quantum efficiency (in %) at a certain luminance LT50 @ 1000 cd/m$^2$ is the lifetime by which the OLED has dropped from an initial luminance of 1000 cd/m$^2$ to 50% of the initial intensity, i.e. to 500 cd/m$^2$. Correspondingly, LT80 @ 10000 cd/m$^2$ is the lifetime by which the OLED has dropped from an initial luminance of 10000 cd/m$^2$ to 80% of the initial intensity. i.e. to 8000 cd/m$^2$.

The properties of the various OLEDs are summarised in Tables 7 a and 7 b Examples C01 and C02 are comparative examples, all other examples show properties of OLEDs according to the invention.

Tables 7 a-b: Properties of the OLEDs

TABLE 7a

| Example | Effiziency at 1000 cd/m² % EQE | Voltage at 1000 cd/m² [V] | LT80 at 10000 cd/m² [h] |
|---|---|---|---|
| C02 | 17.0 | 4.2 | 110 |
| C04 | 16.6 | 4.8 | 250 |
| C05 | 15.3 | 4.9 | 140 |
| C06 | 15.6 | 4.8 | 190 |
| C07 | 16.5 | 4.7 | 200 |
| C10 | 20.8 | 4.9 | 220 |
| C11 | 20.2 | 4.8 | 210 |
| C12 | 20.5 | 4.9 | 260 |
| C13 | 17.5 | 4.5 | 220 |
| C15 | 20.2 | 4.8 | 190 |

TABLE 7b

| Example | Effiziency at 1000 cd/m² % EQE | Voltage at 1000 cd/m² [V] | LT50 at 1000 cd/m² [h] |
|---|---|---|---|
| C01 | 4.9 | 4.5 | 380 |
| C03 | 5.2 | 4.0 | 2100 |
| C08 | 5.9 | 4.4 | 3200 |
| C09 | 9.5 | 4.3 | 1400 |
| C14 | 7.8 | 4.4 | 1800 |

As Tables 7 a-b show, the polymers according to the invention give rise to improvements over the prior art, in particular with respect to lifetime and operating voltage, on use as hole-transport layer in OLEDs. Green- and blue-emitting OLEDs comprising the materials according to the invention are produced.

The invention claimed is:

1. A polymer comprising at least one structural unit of the following formula (I):

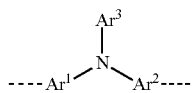

wherein the at least one structural unit of the formula (I) is selected from the structural unit of formula (Ia):

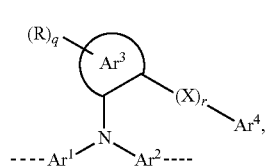

where

Ar$^1$ to Ar$^3$ is on each occurrence, in each case identically or differently, a mono- or polycyclic, aromatic or heteroaromatic ring system having 5 to 60 aromatic ring atoms, which may be substituted by one or more radicals R;

R is on each occurrence, identically or differently, H, D, F, Cl, Br, I, N(R$^1$)$_2$, CN, NO$_2$, Si(R$^1$)$_3$, B(OR$^1$)$_2$, C(=O)R$^1$, P(=O)(R$^1$)$_2$, S(=O)R$^1$, S(=O)$_2$R$^1$, OSO$_2$R$^1$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals R$^1$, where one or more non-adjacent CH$_2$ groups may be replaced by R$^1$C=CR$^1$, C=C, Si(R$^1$)$_2$, C=O, C=S, C=NR$^1$, P(=O)(R$^1$), SO, SO$_2$, NR$^1$, O, S or CONR$^1$ and where one or more H atoms may be replaced by D, F, Cl, Br, I or CN, or a mono- or polycyclic, aromatic or heteroaromatic ring system having 5 to 60 aromatic ring atoms, which may in each case be substituted by one or more radicals R$^1$, or an aryloxy or heteroaryloxy group having 5 to 60 aromatic ring atoms, which may be substituted by one or more radicals R$^1$, or an aralkyl or heteroaralkyl group having 5 to 60 aromatic ring atoms, which may be substituted by one or more radicals R$^1$, or a diarylamino group, diheteroarylamino group or arylheteroarylamino group having 10 to 40 aromatic ring atoms, which may be substituted by one or more radicals R$^1$, or a crosslinkable group Q, where two or more radicals R may also form a mono- or polycyclic, aliphatic, aromatic and/or benzo-fused ring system with one another;

R$^1$ is on each occurrence, identically or differently, H, D, F or an aliphatic hydrocarbon radical having 1 to 20 C atoms, an aromatic and/or a heteroaromatic hydrocarbon radical having 5 to 20 C atoms, in which, in addition, one or more H atoms may be replaced by F; where two or more substituents R$^1$ may also form a mono- or polycyclic, aliphatic or aromatic ring system with one another; and the dashed lines represent bonds to adjacent structural units in the polymer, characterised in that Ar$^3$ is substituted by Ar$^4$ in at least one, preferably in one of the two ortho-positions, where Ar$^4$ is a mono- or polycyclic, aromatic or heteroaromatic ring system having 5 to 60 aromatic ring atoms, which may be substituted by one or more radicals R, q=0, 1, 2, 3, 4, 5 or 6, X=CR$_2$, NR, SiR$_2$, O, S, C=O or P=O, and r=0 or 1.

2. The polymer according to claim 1, wherein Ar$^3$ is substituted by Ar$^4$ in one of the two ortho positions, and Ar$^3$ is additionally linked to Ar$^4$ in the meta position that is adjacent to the substituted ortho position.

3. The polymer according to claim 1, wherein the at least one structural unit of the formula (I) is selected from the structural unit of the following formula (Ib):

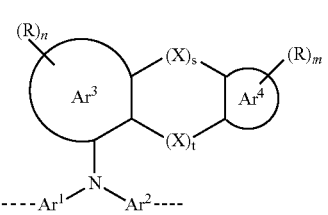

where $Ar^1$, $Ar^2$, $Ar^3$, $Ar^4$, R, and X can adopt the meanings indicated in claim 1, m=0, 1, 2, 3 or 4, and n=0, 1, 2 or 3, and s and t are each 0 or 1, where the sum (s+t)=1 or 2.

4. The polymer according to claim 3, wherein the at least one structural unit of the formula (I) is selected from structural units of the following formulae (II), (III) and (IV):

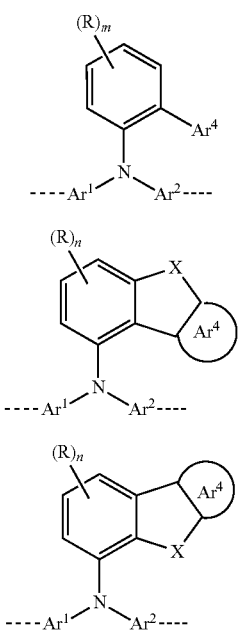

(II)

(III)

(IV)

where $Ar^1$, $Ar^2$, $Ar^4$, R, m, n and X can adopt the meanings indicated in claim 1.

5. The polymer according to claim 4, wherein the at least one structural unit of the formula (II) is selected from the structural unit of the following formula (V):

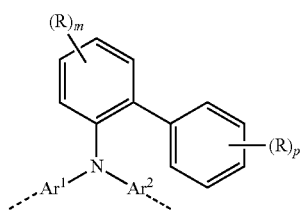

(V)

where $Ar^1$, $Ar^2$, R and m can adopt the meanings indicated in claim 1 and p=0, 1, 2, 3, 4 or 5.

6. The polymer according to claim 4, wherein the at least one structural unit of the formula (III) is selected from the structural unit of the following formula (VI):

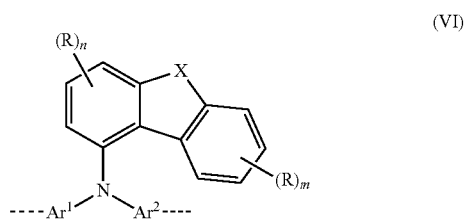

(VI)

where $Ar^1$, $Ar^2$, R, m and n can adopt the meanings indicated in claim 1.

7. The polymer according to claim 4, wherein the at least one structural unit of the formula (IV) is selected from the structural unit of the following formula (VII):

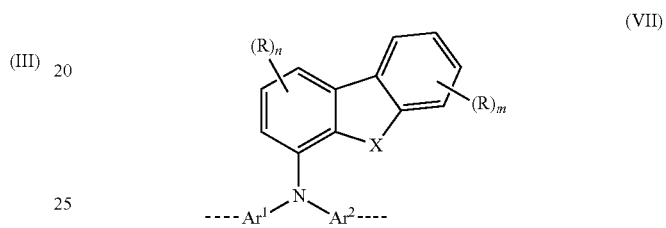

(VII)

where $Ar^1$, $Ar^2$, R, m, n and X can adopt the meanings indicated in claim 1.

8. The polymer according to claim 1, wherein the proportion of structural units of the formula (I), (II), (III), (IV), (V), (VI) or (VII) in the polymer is in the range from 50 to 95 mol %, based on 100 mol % of all copolymerisable monomers which are present as structural units in the polymer.

9. The polymer according to claim 1, wherein the polymer, besides structural units of the formula (I), (II), (III), (IV), (V), (VI) or (VII), also contains further structural units which are different from the structural units of the formulae (I), (II), (III), (IV), (V), (VI) or (VII).

10. A process for the preparation of the polymer according to claim 1, comprising preparing the polymer by SUZUKI polymerisation, YAMAMOTO polymerisation, STILLE polymerisation or HARTWIG-BUCHWALD polymerisation.

11. A polymer blend comprising one or more polymers according to claim 1 comprising at least one structural unit of the formula (I), and one or more further polymeric, oligomeric, dendritic and/or low-molecular-weight substance.

12. A solution or formulation comprising one or more polymer according to claim 1 in one or more solvents.

13. A solution or formulation comprising a polymer blend according to claim 11 in one or more solvents.

14. A method comprising utilizing the polymer according to claim 1 in an electronic or an opto-electronic device.

15. An electronic or an opto-electronic device comprising one or more active layers, wherein at least one of the active layers comprises one or more polymers according to claim 1.

* * * * *